US012417170B2

(12) United States Patent
Tseng et al.

(10) Patent No.: US 12,417,170 B2
(45) Date of Patent: Sep. 16, 2025

(54) COMPUTING SYSTEM AND METHOD OF OPERATION THEREOF

(71) Applicant: MACRONIX INTERNATIONAL CO., LTD., Hsinchu (TW)

(72) Inventors: Po-Hao Tseng, Taichung (TW); Ming-Hsiu Lee, Hsinchu (TW); Tian-Cih Bo, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 229 days.

(21) Appl. No.: 18/195,540

(22) Filed: May 10, 2023

(65) Prior Publication Data

US 2024/0378144 A1    Nov. 14, 2024

(51) Int. Cl.
*G06F 12/00* (2006.01)
*G06F 12/02* (2006.01)

(52) U.S. Cl.
CPC ................ *G06F 12/0246* (2013.01)

(58) Field of Classification Search
CPC . G11C 11/4096; G11C 11/5671; G11C 15/00; G11C 15/04; G11C 16/02;
(Continued)

(56) References Cited

U.S. PATENT DOCUMENTS 4,219,829 A    8/1980  Dorda et al.
4,987,090 A    1/1991  Hsu et al.
(Continued)

FOREIGN PATENT DOCUMENTS

CN    101432821 A    5/2009
CN    1998012 B    11/2010
(Continued)

OTHER PUBLICATIONS

Anonymous, "Data in the Computer", May 11, 2015, pp. 1-8, https://web.archive.org/web/20150511143158/https://homepage.cs.uri.edu/faculty/wolfe/book/Readings/Reading02.htm (Year: 2015)—See Office Action dated Aug. 17, 2020 in U.S. Appl. No. 16/279,494 for relevance—no year provided by examiner.
(Continued)

*Primary Examiner* — Thong Q Le
(74) *Attorney, Agent, or Firm* — Korbin S Van Dyke; Haynes Beffel & Wolfeld LLP

(57) ABSTRACT

A 3D search engine receives searches for application to word lines of a nonvolatile memory array. The engine uses two word lines per bit of information of the searches and two memory devices per bit of stored feature to search against, optionally enabling don't care and/or wildcard encoding. The engine uses respective bit lines of the nonvolatile memory array as respective matching lines for searching. Respective memory strings (e.g., NAND memory strings) of the nonvolatile memory array are usable to store respective data words, e.g., corresponding to features to search for. Respective pluralities of the memory strings are coupled in parallel to respective shared bit lines. Various encodings of features and searches enable exact, approximate, and range matching. The engine has applicability to comparing and sorting, in addition to searching in application areas such as artificial intelligence (AI) and big data.

20 Claims, 19 Drawing Sheets

(58) Field of Classification Search
CPC ........ G11C 16/3459; G11C 2211/5641; G11C 2211/5642; G11C 2213/71; G11C 2213/75; G11C 7/1039; G11C 7/1042; G11C 7/1072; G11C 7/12; G11C 8/08; G11C 11/5628; G11C 16/24; G11C 16/3427; G11C 11/005; G11C 11/4063; G11C 11/419; G11C 11/5621; G11C 14/0063; G11C 16/00; G11C 16/04; G11C 16/30; G11C 7/1006; G11C 7/1069; G11C 7/1096; G06F 12/0246; G06F 15/7821; G06F 3/0604; G06F 3/0658; G06F 3/0659; H01L 2225/06562; H01L 25/0657; H01L 2225/06506; H01L 2225/0651; H01L 2225/06513; H01L 2225/06517; H01L 2225/06541; H01L 25/18; H04L 2012/5685; H10B 43/10; H10B 43/27; H10B 69/00

See application file for complete search history.

(56) References Cited

U.S. PATENT DOCUMENTS

| | | | |
|---|---|---|---|
| 5,029,130 A | 7/1991 | Yeh | |
| 5,586,073 A | 12/1996 | Hiura et al. | |
| 5,963,803 A | 10/1999 | Dawson et al. | |
| 6,034,882 A | 3/2000 | Johnson et al. | |
| 6,107,882 A | 8/2000 | Gabara et al. | |
| 6,313,486 B1 | 11/2001 | Kencke et al. | |
| 6,385,097 B1 | 5/2002 | Liao et al. | |
| 6,486,027 B1 | 11/2002 | Noble et al. | |
| 6,576,385 B2 | 6/2003 | Bode et al. | |
| 6,593,624 B2 | 7/2003 | Walker | |
| 6,829,598 B2 | 12/2004 | Milev | |
| 6,856,542 B2 | 2/2005 | Roy et al. | |
| 6,906,940 B1 | 6/2005 | Lue | |
| 6,960,499 B2 | 11/2005 | Nandakumar et al. | |
| 7,050,318 B1 | 5/2006 | Argyres | |
| 7,081,377 B2 | 7/2006 | Cleeves | |
| 7,089,218 B1 | 8/2006 | Visel | |
| 7,114,026 B1 | 9/2006 | Khanna | |
| 7,129,538 B2 | 10/2006 | Lee et al. | |
| 7,177,169 B2 | 2/2007 | Scheuerlein | |
| 7,324,381 B2 | 1/2008 | Gallo et al. | |
| 7,368,358 B2 | 5/2008 | Ouyang et al. | |
| 7,436,723 B2 | 10/2008 | Rinerson et al. | |
| 7,593,908 B2 | 9/2009 | Abdulkader et al. | |
| 7,646,041 B2 | 1/2010 | Chae et al. | |
| 7,747,668 B2 | 6/2010 | Nomura et al. | |
| 7,907,432 B2 | 3/2011 | Deshpande et al. | |
| 7,948,024 B2 | 5/2011 | Kim et al. | |
| 8,045,355 B2 | 10/2011 | Ueda | |
| 8,154,128 B2 | 4/2012 | Lung | |
| 8,203,187 B2 | 6/2012 | Lung et al. | |
| 8,275,728 B2 | 9/2012 | Pino | |
| 8,331,149 B2 | 12/2012 | Choi et al. | |
| 8,432,719 B2 | 4/2013 | Lue | |
| 8,564,045 B2 | 10/2013 | Liu | |
| 8,589,320 B2 | 11/2013 | Breitwisch et al. | |
| 8,630,114 B2 | 1/2014 | Lue | |
| 8,725,670 B2 | 5/2014 | Visel | |
| 8,837,189 B2 * | 9/2014 | Roohparvar ....... | G11C 16/0483 365/49.1 |
| 8,860,124 B2 | 10/2014 | Lue et al. | |
| 9,064,903 B2 | 6/2015 | Mitchell et al. | |
| 9,111,617 B2 | 8/2015 | Shim et al. | |
| 9,147,468 B1 | 9/2015 | Lue | |
| 9,177,966 B1 | 11/2015 | Rabkin et al. | |
| 9,213,936 B2 | 12/2015 | Visel | |
| 9,379,129 B1 | 6/2016 | Lue et al. | |
| 9,384,835 B2 | 7/2016 | Arsovski et al. | |
| 9,391,084 B2 | 7/2016 | Lue | |
| 9,397,110 B2 | 7/2016 | Lue | |
| 9,401,371 B1 | 7/2016 | Lee et al. | |
| 9,430,735 B1 | 8/2016 | Vali et al. | |
| 9,431,099 B2 | 8/2016 | Lee et al. | |
| 9,520,485 B2 | 12/2016 | Lue | |
| 9,524,980 B2 | 12/2016 | Lue | |
| 9,530,499 B2 | 12/2016 | Bando et al. | |
| 9,535,831 B2 | 1/2017 | Jayasena et al. | |
| 9,536,969 B2 | 1/2017 | Yang et al. | |
| 9,589,982 B1 | 3/2017 | Cheng et al. | |
| 9,698,156 B2 | 7/2017 | Lue | |
| 9,698,185 B2 | 7/2017 | Chen et al. | |
| 9,710,747 B2 | 7/2017 | Kang et al. | |
| 9,747,230 B2 | 8/2017 | Han et al. | |
| 9,754,953 B2 | 9/2017 | Tang et al. | |
| 9,767,028 B2 | 9/2017 | Cheng et al. | |
| 9,898,207 B2 | 2/2018 | Kim et al. | |
| 9,910,605 B2 | 3/2018 | Jayasena et al. | |
| 9,922,716 B2 | 3/2018 | Hsiung et al. | |
| 9,978,454 B2 | 5/2018 | Jung | |
| 9,983,829 B2 | 5/2018 | Ravimohan et al. | |
| 9,991,007 B2 | 6/2018 | Lee et al. | |
| 10,037,167 B2 | 7/2018 | Kwon et al. | |
| 10,043,819 B1 | 8/2018 | Lai et al. | |
| 10,056,149 B2 | 8/2018 | Yamada et al. | |
| 10,073,733 B1 | 9/2018 | Jain et al. | |
| 10,157,012 B2 | 12/2018 | Kelner et al. | |
| 10,175,667 B2 | 1/2019 | Bang et al. | |
| 10,211,218 B2 | 2/2019 | Lue | |
| 10,242,737 B1 | 3/2019 | Lin et al. | |
| 10,283,205 B2 | 5/2019 | Malshe et al. | |
| 10,381,376 B1 | 8/2019 | Nishikawa et al. | |
| 10,403,637 B2 | 9/2019 | Lue | |
| 10,528,643 B1 | 1/2020 | Choi et al. | |
| 10,534,840 B1 | 1/2020 | Petti | |
| 10,540,591 B2 | 1/2020 | Gao et al. | |
| 10,552,759 B2 | 2/2020 | Rich | |
| 10,565,494 B2 | 2/2020 | Henry et al. | |
| 10,635,398 B2 | 4/2020 | Lin et al. | |
| 10,643,713 B1 | 5/2020 | Louie et al. | |
| 10,719,296 B2 | 7/2020 | Lee et al. | |
| 10,777,566 B2 | 9/2020 | Lue | |
| 10,783,963 B1 | 9/2020 | Hung et al. | |
| 10,790,023 B2 | 9/2020 | Harari | |
| 10,790,828 B1 | 9/2020 | Gunter et al. | |
| 10,825,510 B2 | 11/2020 | Jaiswal et al. | |
| 10,860,682 B2 | 12/2020 | Knag et al. | |
| 10,910,393 B2 | 2/2021 | Lai et al. | |
| 10,942,673 B2 | 3/2021 | Shafiee Ardestani et al. | |
| 10,957,392 B2 | 3/2021 | Lee et al. | |
| 11,069,704 B2 | 7/2021 | Lai et al. | |
| 11,127,108 B2 | 9/2021 | Sharma et al. | |
| 11,328,775 B2 | 5/2022 | Tseng et al. | |
| 11,410,028 B2 | 8/2022 | Crill et al. | |
| 11,443,407 B2 | 9/2022 | Sharma et al. | |
| 11,737,274 B2 | 8/2023 | Shen | |
| 11,892,902 B2 | 2/2024 | Liu | |
| 11,916,011 B2 | 2/2024 | Lai et al. | |
| 11,934,480 B2 | 3/2024 | Lue et al. | |
| 11,955,178 B2 | 4/2024 | Kawasumi | |
| 12,086,410 B1 | 9/2024 | Mathuriya et al. | |
| 2001/0055838 A1 | 12/2001 | Walker et al. | |
| 2002/0028541 A1 | 3/2002 | Lee et al. | |
| 2003/0122181 A1 | 7/2003 | Wu | |
| 2005/0088878 A1 | 4/2005 | Eshel | |
| 2005/0219887 A1 | 10/2005 | Hsu et al. | |
| 2005/0280061 A1 | 12/2005 | Lee | |
| 2005/0287793 A1 | 12/2005 | Blanchet et al. | |
| 2007/0158736 A1 | 7/2007 | Arai et al. | |
| 2008/0101109 A1 | 5/2008 | Haring-Bolivar et al. | |
| 2008/0117678 A1 | 5/2008 | Shieh et al. | |
| 2008/0298110 A1 | 12/2008 | Wickeraad et al. | |
| 2009/0097321 A1 | 4/2009 | Kim et al. | |
| 2009/0184360 A1 | 7/2009 | Jin et al. | |
| 2009/0190404 A1 | 7/2009 | Roohparvar | |
| 2010/0172189 A1 | 7/2010 | Itagaki et al. | |
| 2010/0182828 A1 | 7/2010 | Shima et al. | |
| 2010/0202208 A1 | 8/2010 | Endo et al. | |
| 2010/0270593 A1 | 10/2010 | Lung et al. | |
| 2011/0018051 A1 | 1/2011 | Kim et al. | |
| 2011/0063915 A1 | 3/2011 | Tanaka et al. | |

(56) References Cited

U.S. PATENT DOCUMENTS

| | | |
|---|---|---|
| 2011/0106742 A1 | 5/2011 | Pino |
| 2011/0128791 A1 | 6/2011 | Chang et al. |
| 2011/0140070 A1 | 6/2011 | Kim |
| 2011/0194357 A1 | 8/2011 | Han et al. |
| 2011/0286258 A1 | 11/2011 | Chen et al. |
| 2011/0297912 A1 | 12/2011 | Samachisa et al. |
| 2012/0007167 A1 | 1/2012 | Hung et al. |
| 2012/0044742 A1 | 2/2012 | Narayanan |
| 2012/0112264 A1 | 5/2012 | Lee et al. |
| 2012/0182801 A1 | 7/2012 | Lue |
| 2012/0235111 A1 | 9/2012 | Osano et al. |
| 2012/0254087 A1 | 10/2012 | Visel |
| 2013/0070528 A1 | 3/2013 | Maeda |
| 2013/0075684 A1 | 3/2013 | Kinoshita et al. |
| 2013/0119455 A1 | 5/2013 | Chen et al. |
| 2014/0043898 A1 | 2/2014 | Kuo et al. |
| 2014/0063949 A1 | 3/2014 | Tokiwa |
| 2014/0119127 A1 | 5/2014 | Lung et al. |
| 2014/0149773 A1 | 5/2014 | Huang et al. |
| 2014/0153310 A1 | 6/2014 | Sekar et al. |
| 2014/0268996 A1 | 9/2014 | Park |
| 2014/0330762 A1 | 11/2014 | Visel |
| 2015/0008500 A1 | 1/2015 | Fukumoto et al. |
| 2015/0170001 A1 | 6/2015 | Rabinovich et al. |
| 2015/0171106 A1 | 6/2015 | Suh |
| 2015/0179661 A1 | 6/2015 | Huo et al. |
| 2015/0199126 A1 | 7/2015 | Jayasena et al. |
| 2015/0331817 A1 | 11/2015 | Han et al. |
| 2015/0340369 A1 | 11/2015 | Lue |
| 2016/0043100 A1 | 2/2016 | Lee et al. |
| 2016/0141299 A1 | 5/2016 | Hong |
| 2016/0141337 A1 | 5/2016 | Shimabukuro et al. |
| 2016/0181315 A1 | 6/2016 | Lee et al. |
| 2016/0232973 A1 | 8/2016 | Jung |
| 2016/0247579 A1 | 8/2016 | Ueda et al. |
| 2016/0308114 A1 | 10/2016 | Kim et al. |
| 2016/0329341 A1 | 11/2016 | Shimabukuro et al. |
| 2016/0336064 A1 | 11/2016 | Seo et al. |
| 2016/0342892 A1 | 11/2016 | Ross |
| 2016/0342893 A1 | 11/2016 | Ross et al. |
| 2016/0343421 A1 | 11/2016 | Pyo |
| 2016/0358661 A1 | 12/2016 | Vali et al. |
| 2016/0379115 A1 | 12/2016 | Burger et al. |
| 2017/0003889 A1 | 1/2017 | Kim et al. |
| 2017/0025421 A1 | 1/2017 | Sakakibara et al. |
| 2017/0084748 A1 | 3/2017 | Yang |
| 2017/0092370 A1 | 3/2017 | Harari |
| 2017/0103316 A1 | 4/2017 | Ross et al. |
| 2017/0123987 A1 | 5/2017 | Cheng et al. |
| 2017/0148517 A1 | 5/2017 | Harari |
| 2017/0160955 A1 | 6/2017 | Jayasena et al. |
| 2017/0169885 A1 | 6/2017 | Tang et al. |
| 2017/0169887 A1 | 6/2017 | Widjaja |
| 2017/0243879 A1 | 8/2017 | Yu et al. |
| 2017/0263623 A1 | 9/2017 | Zhang et al. |
| 2017/0270405 A1 | 9/2017 | Kurokawa |
| 2017/0287928 A1 | 10/2017 | Kanamori et al. |
| 2017/0309634 A1 | 10/2017 | Noguchi et al. |
| 2017/0316833 A1 | 11/2017 | Ihm et al. |
| 2017/0317096 A1 | 11/2017 | Shin et al. |
| 2017/0337466 A1 | 11/2017 | Bayat et al. |
| 2018/0113649 A1 | 4/2018 | Shafiee Ardestani et al. |
| 2018/0121790 A1 | 5/2018 | Kim et al. |
| 2018/0129424 A1 | 5/2018 | Confalonieri et al. |
| 2018/0129936 A1 | 5/2018 | Young et al. |
| 2018/0144240 A1 | 5/2018 | Garbin et al. |
| 2018/0157488 A1 | 6/2018 | Shu et al. |
| 2018/0173420 A1 | 6/2018 | Li et al. |
| 2018/0182776 A1 | 6/2018 | Kim |
| 2018/0189640 A1 | 7/2018 | Henry et al. |
| 2018/0240522 A1 | 8/2018 | Jung |
| 2018/0246783 A1 | 8/2018 | Avraham et al. |
| 2018/0247195 A1 | 8/2018 | Kumar et al. |
| 2018/0286874 A1 | 10/2018 | Kim et al. |
| 2018/0321942 A1 | 11/2018 | Yu et al. |
| 2018/0342299 A1 | 11/2018 | Yamada et al. |
| 2018/0350823 A1 | 12/2018 | Or-Bach et al. |
| 2019/0019538 A1 | 1/2019 | Li et al. |
| 2019/0019564 A1 | 1/2019 | Li et al. |
| 2019/0035449 A1 | 1/2019 | Saida et al. |
| 2019/0043560 A1 | 2/2019 | Sumbul et al. |
| 2019/0065151 A1 | 2/2019 | Chen et al. |
| 2019/0073564 A1 | 3/2019 | Saliou |
| 2019/0073565 A1 | 3/2019 | Saliou |
| 2019/0088329 A1 | 3/2019 | Tiwari et al. |
| 2019/0102170 A1 | 4/2019 | Chen et al. |
| 2019/0138892 A1 | 5/2019 | Kim et al. |
| 2019/0148393 A1 | 5/2019 | Lue |
| 2019/0164044 A1 | 5/2019 | Song et al. |
| 2019/0164617 A1 | 5/2019 | Tran et al. |
| 2019/0213234 A1 | 7/2019 | Bayat et al. |
| 2019/0220249 A1 | 7/2019 | Lee et al. |
| 2019/0244662 A1 | 8/2019 | Lee et al. |
| 2019/0286419 A1 | 9/2019 | Lin et al. |
| 2019/0311243 A1 | 10/2019 | Whatmough et al. |
| 2019/0311749 A1 | 10/2019 | Song et al. |
| 2019/0325959 A1 | 10/2019 | Bhargava et al. |
| 2019/0340497 A1 | 11/2019 | Baraniuk et al. |
| 2019/0349426 A1 | 11/2019 | Smith et al. |
| 2019/0363131 A1 | 11/2019 | Torng et al. |
| 2020/0026993 A1 | 1/2020 | Otsuka |
| 2020/0065650 A1 | 2/2020 | Tran et al. |
| 2020/0075099 A1 | 3/2020 | Choi et al. |
| 2020/0098784 A1 | 3/2020 | Nagashima et al. |
| 2020/0098787 A1 | 3/2020 | Kaneko |
| 2020/0110990 A1 | 4/2020 | Harada et al. |
| 2020/0117986 A1 | 4/2020 | Burr et al. |
| 2020/0118638 A1 | 4/2020 | Leobandung et al. |
| 2020/0143248 A1 | 5/2020 | Liu et al. |
| 2020/0160165 A1 | 5/2020 | Sarin |
| 2020/0227432 A1 | 7/2020 | Lai et al. |
| 2020/0334015 A1 | 10/2020 | Shibata et al. |
| 2020/0335146 A1 | 10/2020 | Alrod et al. |
| 2020/0343252 A1 | 10/2020 | Lai et al. |
| 2020/0365611 A1 | 11/2020 | Hung et al. |
| 2020/0381450 A1 | 12/2020 | Lue et al. |
| 2020/0402997 A1 | 12/2020 | Ahn et al. |
| 2021/0209468 A1 | 7/2021 | Matsumoto et al. |
| 2021/0240945 A1 | 8/2021 | Strachan et al. |
| 2021/0280250 A1 | 9/2021 | Advani et al. |
| 2021/0295922 A1 | 9/2021 | Huang et al. |
| 2022/0068386 A1 | 3/2022 | Tseng et al. |
| 2022/0093184 A1 | 3/2022 | Kim et al. |
| 2022/0122665 A1 | 4/2022 | De Santis et al. |
| 2022/0284657 A1 | 9/2022 | Müller et al. |
| 2022/0359011 A1 | 11/2022 | Betz et al. |
| 2023/0063076 A1 | 3/2023 | Choi |
| 2023/0073272 A1 | 3/2023 | Okajima et al. |
| 2023/0101654 A1 | 3/2023 | Nava Rodriguez et al. |
| 2024/0064044 A1 | 2/2024 | Liu |

FOREIGN PATENT DOCUMENTS

| | | |
|---|---|---|
| CN | 103778468 A | 5/2014 |
| CN | 105718994 A | 6/2016 |
| CN | 105789139 A | 7/2016 |
| CN | 106530210 A | 3/2017 |
| CN | 106815515 A | 6/2017 |
| CN | 107077879 A | 8/2017 |
| CN | 107368892 A | 11/2017 |
| CN | 107533459 A | 1/2018 |
| CN | 107767905 A | 3/2018 |
| CN | 108268946 A | 7/2018 |
| CN | 109360593 A | 2/2019 |
| CN | 110598752 A | 12/2019 |
| CN | 113544784 A | 10/2021 |
| EP | 2048709 A2 | 4/2009 |
| JP | H0451382 A | 2/1992 |
| JP | 2006127623 A | 5/2006 |
| JP | 2009080892 A | 4/2009 |
| JP | 2013030254 A | 2/2013 |
| JP | 2015523670 A | 8/2015 |
| JP | 2023044545 A | 3/2023 |
| TW | 533528 B | 5/2003 |

(56) References Cited

FOREIGN PATENT DOCUMENTS

| | | |
|---|---|---|
| TW | I310559 B | 6/2009 |
| TW | 201108230 A | 3/2011 |
| TW | 201117213 A | 5/2011 |
| TW | 201523838 A | 6/2015 |
| TW | 201618284 A | 5/2016 |
| TW | 201639206 A | 11/2016 |
| TW | 201715525 A | 5/2017 |
| TW | 201732824 A | 9/2017 |
| TW | 201741943 A | 12/2017 |
| TW | 201802800 A | 1/2018 |
| TW | 201807807 A | 3/2018 |
| TW | 201822203 A | 6/2018 |
| TW | 201939717 A | 10/2019 |
| TW | 202004573 A | 1/2020 |
| TW | 202011285 A | 3/2020 |
| TW | I696077 B | 6/2020 |
| TW | 202046179 A | 12/2020 |
| TW | I718566 B | 2/2021 |
| TW | 202122994 A | 6/2021 |
| TW | I757645 B | 3/2022 |
| TW | 202305804 A | 2/2023 |
| WO | 2012009179 A1 | 1/2012 |
| WO | 2012015450 A1 | 2/2012 |
| WO | 2016060617 A1 | 4/2016 |
| WO | 2016084336 A1 | 6/2016 |
| WO | 2017091338 A1 | 6/2017 |
| WO | 2018201060 A1 | 11/2018 |

OTHER PUBLICATIONS

Aritome, et al., "Reliability issues of flash memory cells," Proc. of the IEEE, vol. 81, No. 5, May 1993, pp. 776-788.

Beasley, "Manufacturing Defects," may be found at https://slideplayer.com/slide/11407304, downloaded May 20, 2020, 61 pages.

Chen et al., "A Highly Pitch Scalable 3D Vertical Gate (VG) NAND Flash Decoded by a Novel Self-Aligned Independently Controlled Double Gate (IDG) StringSelect Transistor (SSL)," 2012 Symp. on VLSI Technology (VLSIT), Jun. 12-14, 2012, pp. 91-92.

Chen et al., "Eyeriss: An Energy-Efficient reconfigurable accelerator for deep convolutional neural networks," IEEE ISSCC, Jan. 31-Feb. 4, 2016, 3 pages.

Choi et al., "Performance Breakthrough in NOR Flash Memory with Dopant-Segregated Schottky-Barrier (DSSB) SONOS Device", 2009 Symposium onVLSI Technology Digest of Technical Papers, Jun. 16-18, 2009, pp. 1-2.

Entegris FAQ Series, "Contamination Control in Ultrapure Chemicals and Water: Fundamentals of Contamination Control," may be found at https://www.entegris.com/en/home/resources/technical-information/faq/contamination-control-in-ultrapure-chemicals-and-water.html., downloaded May 20, 2020, 10 pages.

Fukuzumi et al. "Optimal Integration and Characteristics of Vertical Array Devices for Ultra-High Density, Bit-Cost Scalable Flash Memory," IEEE Dec. 2007, pp. 449-452.

Gonugondla et al., "Energy-Efficient Deep In-memory Architecture for NAND Flash Memories," IEEE International Symposium on Circuits and Systems (ISCAS), May 27-30, 2018, 5 pages.

Guo et al., "Fast, energy-efficient, robust, and reproducible mixed-signal neuromorphic classifier based on embedded NOR flash memory technology," IEEE Int'l Electron Devices Mtg., San Francisco, CA, Dec. 2-6, 2017, 4 pages.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around on Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

IMEC Magazine, Mar. 2018, 35 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Katsumata et al., "Pipe-shaped BiCS flash memory with 16 stacked layers and multi-level-cell operation for ultra high density storage devices," 2009 Symp. on VLSI Technology, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187.

Kim et al., "Multi-Layered Vertical Gate NAND Flash Overcoming Stacking Limit for Terabit Density Storage, "2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim, "Abrasive for Chemical Mechanical Polishing. Abrasive Technology: Characteristics and Applications," Book Abrasive Technology: Characteristics and Applications, Mar. 2018, 20 pages.

Lai et al. "Highly Reliable MA BE-SONOS (Metal-Al2O3 Bandgap Engineered SONOS) Using a SiO2 Buffer Layer," VLSI Technology, Systems and Applications 2008, VLSI-TSA International Symposium on Apr. 21-23, 2008, pp. 58-59.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Liu et al., "Parallelizing SRAM Arrays with Customized Bit-Cell for Binary Neural Networks," 55th ACM/ESDA/IEEE Design Automation Conference (DAC), Sep. 20, 2018, 4 pages.

Lue et al., "A Highly Scalable 8-Layer 3D Vertical-Gate (VG) TFT Nand Flash Using Junction-Free Buried Channel BE-SONOS Device", 2010 Symposium on VLSI Technology Digest of Technical Papers, pp. 131-132, Jun. 15-17, 2010.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

Lue et al., "A Novel Buried-Channel FinFET BE-SONOS NAND Flash with Improved Memory Window and Cycling Endurance", 2009 Symposium on VLSI Technology Digest of Technical Papers, p. 224-225.

Meena, et al., "Overview of emerging nonvolatile memory technologies," Nanoscale Reearch Letters 9:526, Oct. 2, 2014, 34 pages.

Merrikh-Bayat et al., "High-Performance Mixed-Signal Neurocomputing with Nanoscale Flowting-Gate Memory Cell Arrays," in IEEE Transactions on Neural Netowrks and Learning Systems, vol. 29, No. 10, Oct. 2018, pp. 4782-4790.

Minghao Qi, "Ece 695Q Lecture 10: Optical Lithography—Resolution Enhancement Techniques," may be found at https://nanohub.org/resources/15325/watch?resid=24507, Spring 2016, 35 pages.

Nowak et al., "Intrinsic fluctuations in Vertical NAND flash memories," 2012 Symposium on VLSI Technology, Digest of Technical Papers, pp. 21-22, Jun. 12-14, 2012.

(56) References Cited

OTHER PUBLICATIONS

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Paul et al., "Impact of a Process Variation on Nanowire and Nanotube Device Performance", IEEE Transactions on Electron Devices, vol. 54, No. 9, Sep. 2007, p. 2369-2376.

Rincon-Mora, et al., "Bandgaps in the crosshairs: What's the trim target?" IEEE, The Georgia Tech Analog & Power IC Labroator, Oct. 18, 2006, 5 pages.

Rod Nussbaumer, "How is data transmitted through wires in the computer?", Aug. 27, 2015, pp. 1-3, https://www.quora.com/How-is-data-transmitted-through-wires-in-the-computer (Year: 2015)—See Office Action dated Aug. 17, 2020 in U.S. Appl. No. 16/279,494 for relevance—no year provided by examiner.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., " Neuromorphic Computing: From Materials to Systems Architecture," US Dept. of Energy, Oct. 29-30, 2015, Gaithersburg, MD, 40 pages.

Scott Thornton, "What is DRAm (Dynamic Random Access Memory) vs SRAM?", Jun. 22, 2017, pp. 1-11, https://www.microcontrollertips.com/dram-vs-sram/ (Year: 2017)—See Office Action dated Aug. 17, 2020 in U.S. Appl. No. 16/279,494 for relevance—no year provided by examiner.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

The Nikon eReview, "KLA-Tencor Research Scientist Emphasizes Stochastic Challenges at LithoVision 2018," may be found at https://nikonereview.com/2018/kla-tencor-research-scientist-emphasizes-stochastic-challenges-at-lithovision-Spring 2018, 7 pages.

Tseng et al., "In-Memory Approximate Computing Architecture Based on 3D-NAND Flash Memories," 2022 IEEE Symposium on VLSI Technology and Circuits (VLSI Technology and Circuits), Honolulu, HI, USA, Jun. 2022, pp. 270-271.

Tseng et al., "In-Memory-Searching Architecture Based on 3D-NAND Technology with Ultra-high Parallelism," 2020 IEEE International Electron Devices Meeting (IEDM), San Francisco, CA, USA, Dec. 2020, pp. 36.1.1-36.1.4.

Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

Webopedia, "DRAM—dynamic random access memory", Jan. 21, 2017, pp. 1-3, https://web.archive.org/web/20170121124008/https://www.webopedia.com/TERM/D/DRAM.html (Year: 2017)—See Office Action dated Aug. 17, 2020 in U.S. Appl. No. 16/279,494 for relevance—no year provided by examiner.

Webopedia, "SoC", Oct. 5, 2011, pp. 1-2, https://web.archive.org/web/20111005173630/https://www.webopedia.com/TERM/S/SoC.html (Year: 2011)—See Office Action dated Aug. 17, 2020 in U.S. Appl. No. 16/279,494 for relevance—No month provided by examiner.

Li et al., "1Mb 0.41 um2 2T-2R cell nonvolatile TCAM with two-bit encoding and clocked self-referenced sensing," 2013 Symposium on VLSI Technology, Kyoto, Japan, Jun. 11-13, 2013, 12 pages.

Webopedia, "volatile memory", Oct. 9, 2017, pp. 1-4, https://web.archive.org/web/20171009201852/https://www.webopedia.com/TERMN/volatile_memory.html (Year: 2017)—See Office Action dated Aug. 17, 2020 in U.S. Appl. No. 16/279,494 for relevance—no year provided by examiner.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Y.X. Liu et al., "Comparative Study of Tri-Gate and Double-Gate-Type Poly-Si Fin-Channel Spli-Gate Flash Memories," 2012 IEEE Silicon Nanoelectronics Workshop (SNW), Honolulu, HI, Jun. 10-11, 2012, pp. 1-2.

\* cited by examiner

| Value, 251 | Expansion Encoding, 252 |
|---|---|
| 0 | 0000_0000_0000_0000_0000_0000_0000_0000_0000_0000_0000_0000_0000_0000_0000_0000 |
| 1 | 0000_0000_0000_0000_0000_0000_0000_0000_0000_0000_0000_0000_0000_0000_0000_0001 |
| 2 | 0000_0000_0000_0000_0000_0000_0000_0000_0000_0000_0000_0000_0000_0000_0000_0011 |
| ... | ... |
| 30 | 0000_0000_0000_0000_0000_0000_0000_0011_1111_1111_1111_1111_1111_1111_1111_1111 |
| ... | ... |
| 62 | 0011_1111_1111_1111_1111_1111_1111_1111_1111_1111_1111_1111_1111_1111_1111_1111 |
| 63 | 0111_1111_1111_1111_1111_1111_1111_1111_1111_1111_1111_1111_1111_1111_1111_1111 |

FIG. 2

| Value, 351 | One-Hot Encoding, 352 |
|---|---|
| 0 | 1000_0000_0000_0000_0000_0000_0000_0000_0000_0000_0000_0000_0000_0000_0000_0000 |
| 1 | 0100_0000_0000_0000_0000_0000_0000_0000_0000_0000_0000_0000_0000_0000_0000_0000 |
| 2 | 0010_0000_0000_0000_0000_0000_0000_0000_0000_0000_0000_0000_0000_0000_0000_0000 |
| ... | ... |
| 30 | 0000_0000_0000_0000_0000_0000_0000_0010_0000_0000_0000_0000_0000_0000_0000_0000 |
| ... | ... |
| 62 | 0000_0000_0000_0000_0000_0000_0000_0000_0000_0000_0000_0000_0000_0000_0000_0010 |
| 63 | 0000_0000_0000_0000_0000_0000_0000_0000_0000_0000_0000_0000_0000_0000_0000_0001 |

FIG. 3

| Input, 450 |
|---|
| 0000_0000_0000_0000_0000_0000_0000_0000_0000_0000_0000_0000_0000_0000_0000_0001 |

| Value, 451 | Expansion Encoding, 452 | HD, 453 |
|---|---|---|
| 0 | 0000_0000_0000_0000_0000_0000_0000_0000_0000_0000_0000_0000_0000_0000_0000_0000 | 1 |
| 1 | 0000_0000_0000_0000_0000_0000_0000_0000_0000_0000_0000_0000_0000_0000_0000_0000 | 0 |
| 2 | 0000_0000_0000_0000_0000_0000_0000_0000_0000_0000_0000_0000_0000_0000_0000_0001 | 1 |
| 30 | 0000_0000_0000_0000_0000_0000_0000_0000_0000_0011_1111_1111_1111_1111_1111_1111 | 29 |
| 62 | 0011_1111_1111_1111_1111_1111_1111_1111_1111_1111_1111_1111_1111_1111_1111_1111 | 61 |
| 63 | 0111_1111_1111_1111_1111_1111_1111_1111_1111_1111_1111_1111_1111_1111_1111_1111 | 62 |

FIG. 4B

| Search Value, 555 | Reverse Expansion Encoding, 554 |
|---|---|
| 0 | 1111_1111_1111_1111_1111_1111_1111_1111_1111_1111_1111_1111_1111_1111_1111_1111 |
| 1 | 1111_1111_1111_1111_1111_1111_1111_1111_1111_1111_1111_1111_1111_1111_1111_1110 |
| 2 | 1111_1111_1111_1111_1111_1111_1111_1111_1111_1111_1111_1111_1111_1111_1111_1100 |
| ... | ... |
| 62 | 1100_0000_0000_0000_0000_0000_0000_0000_0000_0000_0000_0000_0000_0000_0000_0000 |
| 63 | 1000_0000_0000_0000_0000_0000_0000_0000_0000_0000_0000_0000_0000_0000_0000_0000 |

| Search Value Example, 550 |
|---|
| 1111_1111_1111_1111_1111_1111_1111_1111_1111_1111_1111_1111_1111_1111_1111_1110 |

| Stored Value, 551 | Expansion Encoding, 552 | HD, 553 |
|---|---|---|
| 0 | 0000_0000_0000_0000_0000_0000_0000_0000_0000_0000_0000_0000_0000_0000_0000_0000 | 63 |
| 1 | 0000_0000_0000_0000_0000_0000_0000_0000_0000_0000_0000_0000_0000_0000_0000_0001 | 64 |
| 2 | 0000_0000_0000_0000_0000_0000_0000_0000_0000_0000_0000_0000_0000_0000_0000_0011 | 63 |
| ... | ... | ... |
| 30 | 0000_0000_0000_0000_0000_0000_0000_0000_0011_1111_1111_1111_1111_1111_1111_1111 | 35 |
| 62 | 0011_1111_1111_1111_1111_1111_1111_1111_1111_1111_1111_1111_1111_1111_1111_1111 | 2 |
| 63 | 0111_1111_1111_1111_1111_1111_1111_1111_1111_1111_1111_1111_1111_1111_1111_1111 | 1 |

FIG. 5A

| Input, 750 |
| --- |
| 2 |
| 0010_0000_0000_0000_0000_0000_0000_0000_0000_0000_0000_0000_0000_0000_0000_0000 |

| Value Range, 751 | One-Hot Encoding with Stored Ranges, 752 | Match?, 753 |
| --- | --- | --- |
| 0 - 2 | 1XX0_0000_0000_0000_0000_0000_0000_0000_0000_0000_0000_0000_0000_0000_0000_0000 | Match |
| 0 - 3 | X1XX_0000_0000_0000_0000_0000_0000_0000_0000_0000_0000_0000_0000_0000_0000_0000 | Match |
| 0 - 4 | XX1X_X000_0000_0000_0000_0000_0000_0000_0000_0000_0000_0000_0000_0000_0000_0000 | Match |
| 28 - 32 | 0000_0000_0000_0000_0000_0000_0000_XX1X_X000_0000_0000_0000_0000_0000_0000_0000 | Mismatch |
| 60 - 63 | 0000_0000_0000_0000_0000_0000_0000_0000_0000_0000_0000_0000_0000_0000_0000_XX1X | Mismatch |
| 61 - 63 | 0000_0000_0000_0000_0000_0000_0000_0000_0000_0000_0000_0000_0000_0000_0000_0XX1 | Mismatch |

FIG. 7A

One-Hot Encoding on Input Range Example, 760

| | |
|---|---|
| 0 - 4 | XX1X_X000_0000_0000_0000_0000_0000_0000_0000_0000_0000_0000_0000_0000_0000_0000_0000 |

| Value, 761 | One-Hot Encoding, 762 | Match?, 763 |
|---|---|---|
| 0 | 1000_0000_0000_0000_0000_0000_0000_0000_0000_0000_0000_0000_0000_0000_0000_0000 | Match |
| 1 | 0100_0000_0000_0000_0000_0000_0000_0000_0000_0000_0000_0000_0000_0000_0000_0000 | Match |
| 2 | 0010_0000_0000_0000_0000_0000_0000_0000_0000_0000_0000_0000_0000_0000_0000_0000 | Match |
| ... | ... | ... |
| 30 | 0000_0000_0000_0000_0000_0000_0000_0010_0000_0000_0000_0000_0000_0000_0000_0000 | Mismatch |
| ... | ... | ... |
| 62 | 0000_0000_0000_0000_0000_0000_0000_0000_0000_0000_0000_0000_0000_0000_0000_0010 | Mismatch |
| 63 | 0000_0000_0000_0000_0000_0000_0000_0000_0000_0000_0000_0000_0000_0000_0000_0001 | Mismatch |

FIG. 7B

COMPUTING SYSTEM AND METHOD OF OPERATION THEREOF

BACKGROUND

Field

This disclosure relates to 3D in-memory searching (IMS), implementable using 3D-NAND memory and as applicable to big data and/or artificial intelligence (AI) processing.

Description of Related Art

Growth of big data and AI (such as AI hardware accelerators) are increasing the importance of searching, comparing, and/or sorting data. Conventional systems implement concurrent searching using ternary content addressable memory (TCAM) technology.

Conventional TCAM technology is implementable using static randomly accessible memory (SRAM) techniques, and thus has relatively low memory density (such as 16 transistors to form a single TCAM cell) and relatively high power usage.

Recently proposed TCAM technology is implementable using nonvolatile memory techniques, such as based on two transistor two resistor (2T2R) techniques and two ferroelectric field-effect transistor (2FeFET) techniques. However, the nonvolatile-implemented TCAM techniques require paired memory for a single TCAM cell (or paired memory cells to implement one search bit or one data bit) and therefore efficiency of searching and data storage is limited.

Example techniques using NAND-flash-based IMS functions enabled to perform exact matching and approximate matching operations are described in P. H. Tseng et al., In-Memory-Searching Architecture Based on 3D-NAND Technology with Ultra-high Parallelism, 2020 IEDM; and P. H. Tseng et al., In-Memory Approximate Computing Architecture Based on 3D-NAND Flash Memories, 2022 VLSI.

Thus, techniques are needed that enable high performance searching, comparing, and/or sorting, such as relating to big data and/or AI processing.

SUMMARY

A system of one or more computers is configurable to perform particular operations or actions by virtue of having software, firmware, hardware, or a combination of them installed on the system that in operation causes or cause the system to perform the actions. One or more computer programs are configurable to perform particular operations or actions by virtue of including instructions that, when executed by data processing apparatus, cause the apparatus to perform the actions.

A first aspect includes a computing system having a plurality of memories. Each of memory optionally includes a respective match line coupled to a respective sense amplifier, a respective source line, and a respective plurality of memory strings each coupled to (a) the respective match line and (b) the respective source line, and each memory string optionally includes a respective plurality of series-connected floating-gate transistors each having and being responsive to (c) a respective configured state and (d) a respective control input. The engine also includes a plurality of word lines each coupled to a respective one of the respective control inputs of each of the series-connected floating-gate transistors; and a search encoder enabled to receive a search and drive the word lines according to a search encoding; where (e) each memory string is enabled to couple the respective match and source lines that the respective memory string is coupled to via an a match-found impedance responsive to the configured states of the memory string exactly matching the control inputs of the series-connected floating-gate transistors of the memory string, and (f) each sense amplifier is enabled to generate a respective indication of whether the match line it is coupled to is coupled to the source line via the match-found impedance; and where (g) each memory string is further enabled to couple the respective match and source lines that the memory string is coupled to via a no-match-found impedance responsive to the configured states of the memory string not exactly matching the control inputs of the series-connected floating-gate transistors of the memory string, and (h) each sense amplifier is further enabled to generate a respective indication of whether the match line it is coupled to is coupled to the source line via the no-match-found impedance.

Other embodiments of the first aspect include corresponding computer systems, apparatus, and computer programs recorded on one or more computer storage devices, each configured to perform the actions of the methods.

Some computing systems optionally include one or more of the following features. The computing system where the word lines are operated in pairs according to the search encoding and the configured states are managed in pairs according to a feature encoding. Each of the configured states corresponds to a respective threshold voltage. Each of the respective control inputs is coupled to a respective gate of one more of the series-connected floating-gate transistors. The threshold voltages are settable via one or more programming operations. Each of the memory strings optionally includes a respective memory string enable device responsive to a respective memory string enable control input to selectively enable or disable the respective memory string independently of the word lines. Implementations of the described techniques optionally includes hardware, a method or process, or computer software on a computer-accessible medium.

A second aspect includes a method that includes receiving one or more search parameters; encoding the search parameters according to a particular one of a plurality of search encodings to generate pairs of word line voltages, the particular search encoding enabling a search for a match with a feature stored in a pair of floating-gate transistors according to a particular one of a plurality of feature encodings, and where the particular search encoding and the particular feature encoding enable representation of a one, a zero, and either a one or a zero; driving pairs of word lines of a plurality of series-connected instances of the pair of floating-gate transistors according to the generated word line voltages, the series-connected instances organized as respective pluralities of memory strings operable in parallel to affect a plurality of shared match lines, each shared match line coupled to two or more of the memory strings, and each pair of word lines coupled to at least two of the instances of the pair of floating-gate transistors; sensing voltage changes on the shared match lines to determine which of the shared match lines have a voltage change greater than a predetermined sense threshold; and providing results of the determining as indications of relative matching between the search parameters and the stored features. Other embodiments of the second aspect include corresponding computer systems, apparatus, and computer programs recorded on one or more computer storage devices, each configured to perform the actions of the methods.

Some methods optionally include one or more of the following features. The method where at least one of the plurality of search encodings or at least one of the plurality of feature encodings is in accordance with at least one of an expansion encoding and a one-hot encoding. At least one of the plurality of search encodings or at least one of the plurality of feature encodings is in accordance with a reverse expansion encoding. At least one of the stored features corresponds to a range stored using a one-hot encoding. At least one of the pairs of word line voltages is in accordance with a range encoded as a one-hot encoding. At least one of the plurality of search encodings or at least one of the plurality of feature encodings is in accordance with a low effect encoding. Implementations of the described techniques optionally include hardware, a method or process, or computer software on a computer-accessible medium.

A third aspect includes a computing system that includes interface circuitry to enable a host agent to provide a search and to receive one or more results of the search; a plurality of blocks of memory strings, each block optionally includes a respective plurality of memory strings each receiving a same set of word lines having voltages determinable responsive to the search; a plurality of sense amplifiers each coupled to a corresponding one of the memory strings from each of the blocks; and priority encoder circuitry enabled to receive match indications from the sense amplifiers; where the sense amplifiers are enabled to determine, with respect to matches between (1) feature information stored in the memory strings coupled to the sense amplifier and (2) the word lines received by the memory strings coupled to the sense amplifier, that (3) there are no matches and (4) there is at least one match; and where the priority encoder circuitry, based on the determinations of the sense amplifiers, is enabled to indicate at least a portion of the results as a highest priority match of any matches identified by the sense amplifiers. Some computing systems include corresponding computer systems, apparatus, and computer programs recorded on one or more computer storage devices, each configured to perform the actions of the methods.

Implementations optionally include one or more of the following features. The computing system optionally includes the host agent. The priority encoder circuitry, based on the determinations of the sense amplifiers, is enabled to indicate at least a portion of the results as a second highest priority match of any matches identified by the sense amplifiers. The feature information is stored in the memory strings by configuring threshold voltages of floating-gate transistors of the memory strings. Two or more of the blocks are operable concurrently. A feature encoding is used to encode at least some of the feature information and a search encoding is used to encode at least a portion of the search. The feature encoding is at least one of an expansion encoding, a reverse expansion encoding, a one-hot encoding, and a low effect encoding. The computing system is part of a system-on-a-chip (SOC). Implementations of the described techniques optionally include hardware, a method or process, or computer software on a computer-accessible medium.

BRIEF DESCRIPTION OF THE DRAWINGS

FIG. 2 illustrates an example expansion encoding for a 3D (search) engine.

FIG. 3 illustrates an example one-hot encoding for a 3D (search) engine.

FIG. 4B illustrates an example expansion encoding with Hamming distances compared to an input of 1.

FIG. 5A illustrates an example reverse expansion encoding for search inputs of a 3D (search) engine.

FIG. 7A illustrates an example of one-hot encoding with stored ranges.

FIG. 7B illustrates a one-hot encoding on input range example.

DETAILED DESCRIPTION

Figure 1A:
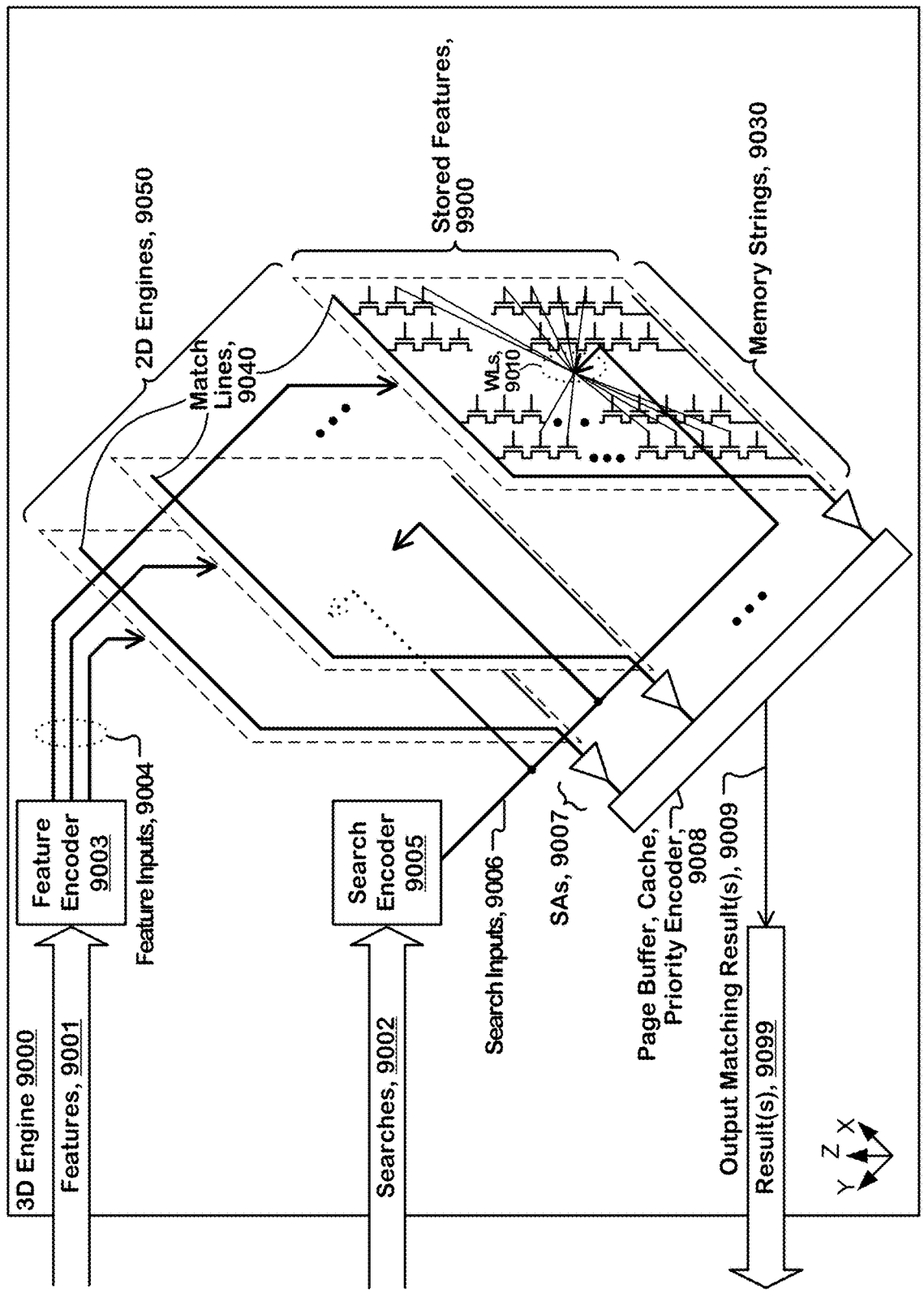
FIG. 1A, FIG. 1B, and FIG. 1C collectively illustrate various aspects of an example 3D (search) engine.

A detailed description of techniques relating to architecture for a 3D search engine is provided with reference to FIGS. 1A-10.

One or more flow diagrams are described herein. Processing described by the flow diagrams is implementable and/or directable using processors programmed using computer programs stored in memory accessible to computer systems and executable by the processors, using dedicated logic hardware (including field programmable integrated circuits), and using various combinations thereof. Various actions are combinable, performable in parallel, and/or performable in a different sequence without affecting processing achieved. In some cases, a rearrangement of actions achieves identical results only if certain other changes are made as well. In other cases, a rearrangement of actions achieves identical results only if certain conditions are satisfied. Furthermore, for clarity, some of the flow diagrams herein omit certain some actions not necessary for understanding the disclosed techniques. Various additional actions are performable before, after, and/or between the illustrated actions.

Examples of selected acronyms, mnemonics, and abbreviations used in the description are as follows.

| Acronym/Mnemonic/Abbreviation | Example |
| --- | --- |
| 2FeFET | Two Ferroelectric Field Effect Transistor |
| 2T0C (DRAM-like device) | Two-Transistor Zero-Capacitor |
| 2T2R | Two Transistor Two Resistor |
| AI | Artificial Intelligence |
| BL | Bit Line |
| CSL | Common Source Line |
| DNA | DeoxyriboNucleic Acid |
| DRAM | Dynamic Random Access read/write Memory |
| FeFET | Ferroelectric Field-Effect Transistor |
| GSL | Ground Select Line |
| HD | Hamming Distance |
| IMS | In-Memory Searching |
| NAND | Not AND; e.g., series connection of devices forming a memory string |
| SA | Sense Amplifier |
| SLC | Single-Level Cell |
| SONOS (memory) | Silicon-Oxide-Nitride-Oxide-Silicon (memory) |
| SRAM | Static Random Access read/write Memory |
| SSD | Solid State Drive |
| SSL | String Select Line |
| TCAM | Ternary Content Accessible Memory |
| WL | Word Line |

An example of a memory string is a series-connected plurality of memory devices. An example of a memory device is an element enabled to store information to indicate one of at least two mutually exclusive states of the memory device. The states are settable via programming the memory device and are readable via activating a control input of the memory device. In some types of memory devices, the programming is via configuring a threshold voltage of the memory device. The configuring is sometimes referred to as programming the memory device (e.g., to a one or a zero). Sometimes the configuring is simply referred to as storing the value (e.g., a one or a zero).

3D (Search) Engine Concepts

Disclosed herein is a novel 3D search engine architecture implementable using 3D-NAND memory that enables high performance searching, comparing, and/or sorting, such as relating to big data and/or AI processing. The architecture provides for low latency, high resolution, high content density, multi-block functionality, and robust reliability. The architecture is applicable to various fields such as big-data searching, AI hardware accelerators and/or classifiers, approximate computing, associative memory, few-shot learning, SSD data management, DNA matching, data filtering, hyper-dimensional computing, as well as other applications benefiting from IMS enabled for long search words and large data capacities. Since the architecture enables high performance comparing and sorting, as well as searching, the term "search" is parenthetical as in "3D (search) engine" as well as in "2D (search) engine".

A novel 3D (search) engine receives searches for application to word lines of a nonvolatile memory array. The 3D (search) engine uses two word lines per bit of information of the searches. The 3D (search) engine uses respective bit lines of the nonvolatile memory array as respective matching lines for searching. Respective memory strings (e.g., NAND memory strings) of the nonvolatile memory array are usable to store respective data words, e.g., corresponding to features to search for. Respective pluralities of the memory strings are coupled in parallel to respective shared bit lines.

In some usage scenarios, read latency of a 3D (search) engine is reduced (at the potential expense of a relatively large current transient) by operating multiple blocks concurrently. The concurrent operating is via switching a plurality of activation controls, e.g., string select lines (SSLs).

In some usage scenarios, a 3D (search) engine is used with expansion encoding and/or one-hot encoding to facilitate, e.g., optional range searching capability.

A 3D (search) engine has specific applicability to big data and/or AI, such as for various searching, comparing, and/or sorting operations. A host agent directs storage of features in the 3D (search) engine and then provides searches to the 3D (search) engine to determine matches to the stored features. Indications of the matches are returned to the host agent.

A 3D (search) engine uses a plurality of 2D (search) engines to perform operations concurrently across the 2D (search) engines and can be referred to as a "Search Cube" or simply a "Cube". The 3D (search) engine is enabled to perform a plurality of searches concurrently using a plurality of search parameters across a plurality of stored features. In some usage contexts, the concurrent searching is per 2D (search) engine. For instance, each 2D (search) engine is tasked with a unique search operation. In some usage contexts, the concurrent searching is within a particular 2D (search) engine. For instance, different portions of the particular 2D (search) engine are tasked with a unique search operation. In some usage contexts, the concurrent searching is parallelized across a plurality of 2D (search) engines and within one or more of the 2D (search) engines. Indications of matches between the search parameters and the stored features are provided by the 2D (search) engines for processing. The processing includes, for example, determining an overall similarity between the search parameters and the stored features and/or identifying which one or more stored features that are similar compared to the search parameters, e.g., via one or more of buffering, caching, and/or priority encoding (circuitry).

Each 2D (search) engine used by the 3D (search) engine comprises a plurality of memory devices, to detect if there is a match between search information provided to the 2D (search) engines as determined from the search parameters and features stored in the 2D (search) engines. The 2D (search) engines generate match indications responsive to the detecting and provide the match indications for buffering, caching, priority encoding, and output for usage in a system. The features are stored according to a feature storage encoding. The search information is encoded according to a search encoding. Examples of the storage and feature encodings include expansion encoding, one-hot encoding, low effect encoding, and reverse expansion encoding. The 3D (search) engine is enabled to selectively perform exact and approximate matching, such as according to storage and/or feature encoding. An exact match corresponds to all bits matching, such as all bits of search parameters matching all bits of a value stored in a memory string. An approximate match corresponds to less than all bits matching, such as all but one bit matching, all but two bits matching, or alternatively a fraction of the bits matching, such as 90% of the bits matching (e.g., 9 out of 10 bits match).

A control agent of the 3D (search) engine selectively operates the 2D (search) engines concurrently. The concurrent operation enables concurrent match determinations against a same set of search information provided to the 2D (search) engines operating concurrently. Each 2D (search)

engine generates a match indication according to the search information and the features stored in the 2D (search) engine. A priority encoder of the 3D (search) engine processes the match indications to determine relative matching between the 2D (search) engines and/or within one or more of the 2D (search) engines.

A 2D (search) engine has a number of memory strings operable concurrently. The memory strings of a 2D (search) engine are coupled in parallel between a match line and a source line of the 2D (search) engine. Each of the memory strings is usable to store a respective feature, each feature having a plurality of bits and stored according to a selected one of the feature encodings. Each of the memory strings is usable to compare an (encoded) search input with an (encoded) feature stored in the memory string. Prior to searching, the control agent performs pair-wise programming of the features into the memory devices according to the selected feature encoding. The pair-wise programming is according to using a series-connected pair of the memory devices for each bit of a feature. For searching, the control agent drives the control inputs in pairs, according to the search information and according to the selected search encoding. The search information comprises a search pattern and optional mask and/or range information, for use in encodings that enable searching according to ranges. Results of the searching are provided as a plurality of match indications that are then optionally buffered, cached, and/or priority encoded.

3D (Search) Engine Example Implementation

An example 3D (search) engine implementation uses floating-gate transistors as memory devices. The floating-gate transistors are instantiated in NAND series-coupled memory strings. Thus, the 3D (search) engine is sometimes referred to as a 3D NAND search engine or more broadly as a search system or alternatively as a computing system. The memory strings are in turn instantiated in parallel between a shared bit line and a shared source line. The memory strings coupled to a shared bit line are sometimes referred to as a 2D (search) engine or more broadly as a memory.

The floating-gate transistors are programmed to store bits of features according to at least two mutually exclusive states. The programming configures the threshold voltages of the floating-gate transistors. The programmed floating-gate transistors are conditionally responsive (e.g., via an impedance change) to indicate a match between a stored feature and a search provided on word lines coupled to control gates of the floating-gate transistors.

The word lines are usable to provide one or more search inputs to search for among the stored features that have been programmed into the floating-gate devices of the memory strings. Each memory string is usable to compare a search value provided via the word lines coupled to the memory string to the stored feature that has been programmed into the memory string.

Each shared bit line is usable as a match line to indicate zero, one, or more matches between one or more search inputs respectively provided to each memory string coupled to the shared bit line and the stored features of the respective memory strings.

Match indications provided by the shared bit lines are priority encoded (e.g., according to a predetermined priority scheme) and one or more matching results are indicated to one or more other agents of a system. Thus, a plurality of 2D (search) results are combined into one or more 3D (search) results.

Figure 1B:
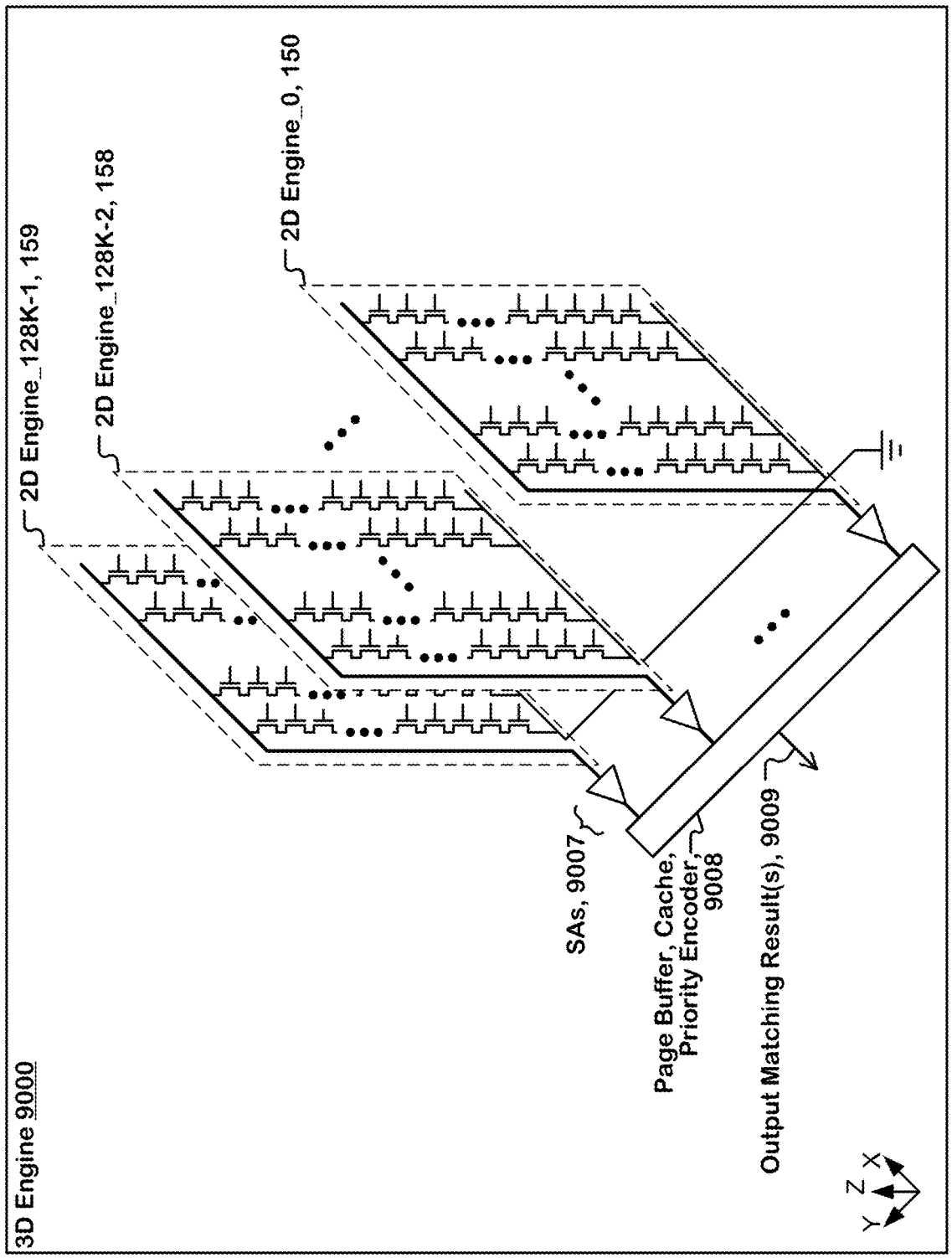
Figure 1C:
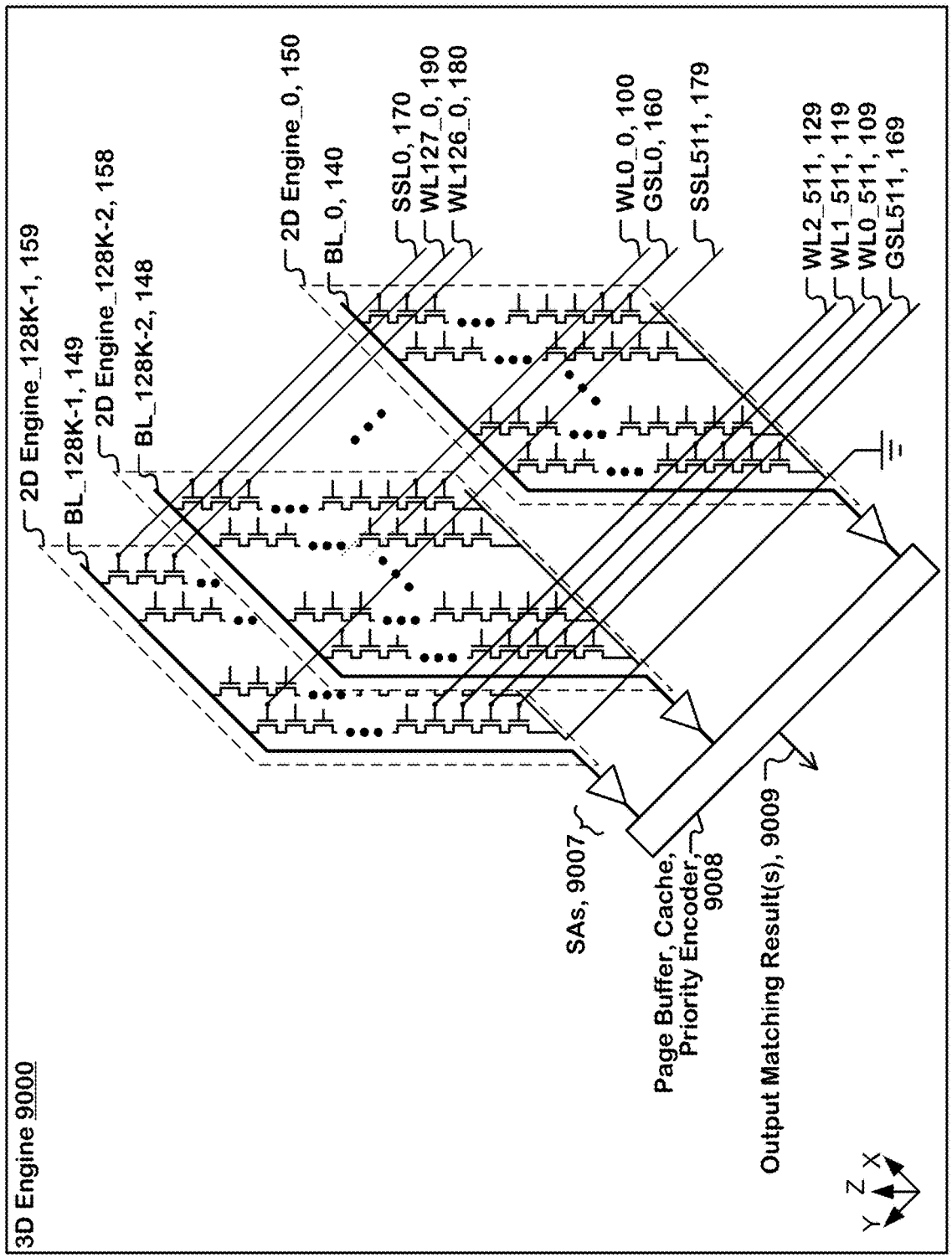

FIG. 1A-FIG. 1C collectively illustrate various aspects of an example 3D (search) engine, such as a NAND-based 3D (search) engine, as 3D Engine 9000.

FIG. 1A illustrates an overview of an example 3D (search) engine, FIG. 1B illustrates some aspects of the example 3D (search) engine of FIG. 1A in different detail, and FIG. 1C illustrates some aspects of the example 3D (search) engine of FIG. 1A in more detail.

Returning to FIG. 1A, for clarity, the figure is simplified. 3D Engine 9000 comprises a plurality (e.g., 128K) of identical (or alternatively substantially similar) 2D (search) engines, as 2D Engines 9050. For clarity, any details of all but one of the 2D (search) engines are omitted.

Each of the 2D (search) engines of 2D Engines 9050 has a plurality of memory strings, conceptually represented by Memory Strings 9030, to store feature information provided to 3D Engine 9000. The stored features are conceptually represented by Stored Features 9900. Memory Strings 9030 are also used to determine matches between the stored feature information and search information provided to 3D Engine 9000 by conditionally affecting respective match lines of Match Lines 9040. For example, the conditionally affecting includes discharging a precharged value of a match line based on a match between a portion of the search inputs and a portion of the stored features.

Feature Encoder 9003 receives Features 9001 (e.g., sourced by a host agent) provided to 3D Engine 9000. In response, Feature Encoder 9003 generates, via a selected feature encoding, Feature Inputs 9004 suitable for application to the memory strings of the 2D (search) engines to store as portions of Stored Features 9900. Each memory string of each 2D (search) engine is enabled to store unique features, and thus Feature Inputs 9004 is represented as having unique couplings to each of the 2D (search) engines of 2D Engines 9050. The unique couplings are implementable via separate signals to each of the 2D (search) engines, a shared time-multiplexed set of shared signals (e.g., a bus), or any other suitable communication mechanism that enables each of the memory strings of each of the 2D (search) engines to store unique features.

Search Encoder 9005 receives Searches 9002 (e.g., sourced by the host agent) provided to 3D Engine 9000. In response, Search Encoder 9005 generates, via a selected search encoding, Search Inputs 9006, suitable for application to the memory strings of the 2D (search) engines of 2D Engines 9050 to determine matches (if any) between Search Inputs 9006 and Stored Features 9900. Each 2D (search) engine receives identical search information, and thus Search Inputs 9006 is represented as having parallel couplings to each of the 2D (search) engines. This is in contrast with the unique couplings used for distribution of feature information. The parallel couplings are implementable via separately buffered signals to each of the 2D (search) engines, a single set of coupled signals (e.g., a bus), or any other suitable communication mechanism that enables each of the 2D (search) engines to receive identical search information. Each memory device of each memory string of a particular 2D (search) engine receives a unique word line (as provided via Search Inputs 9006) as conceptually illustrated in FIG. 1A as a sampling of word lines illustrated as WLs 9010. While each 2D (search) engine receives identical search information, each of the memory strings within a 2D (search) engine receives unique search information.

Responsive to Search Inputs 9006 and based on Stored Features 9900 of each of the 2D (search) engines, each 2D (search) engine bit line (e.g., each of Match Lines 9040) provides respective match information to a respective sense amplifier of SAs 9007 to determine match indications for each of the 2D (search) engines. The match indications are then processed by Page Buffer, Cache, Priority Encoder 9008 and provided as Output Matching Result(s) 9009, and communicated, e.g., to the host agent as Result(s) 9099.

Turning now to FIG. 1B, some aspects the example 3D (search) engine of FIG. 1A are illustrated in more detail. Elements of FIG. 1B and FIG. 1A having identical element identifiers are identical elements. As with FIG. 1A, for clarity, FIG. 1B is simplified.

Three of the 2D (search) engines (2D (search) Engine_0 150, 2D (search) Engine_128K-2 158, and 2D (search) Engine_128K-1 159) are illustrated as having respectively concurrently operable memory strings. As summarized with respect to FIG. 1A, 3D Engine 9000 comprises sense amplifier circuitry. There is one sense amplifier for each 2D (search) engine, collectively SAs 9007. For clarity, three of the sense amplifiers are illustrated, each coupled to a respective one of the illustrated 2D (search) engines. 3D Engine 9000 further comprises post-sensing circuitry, collectively Page Buffer, Cache, Priority Encoder 9008 to process output(s) of each of the sense amplifiers of SAs 9007 to produce results of matching searches as Output Matching Result(s) 9009.

Each of the 2D (search) engines are illustrated in the X and Z dimensions. In some variations built as an integrated circuit based on a planar process, layers of the integrated circuit are built up in the Z dimension. The 2D (search) engines are arrayed in the Y dimension.

Turning now to FIG. 1C, some aspects the example 3D (search) engine of FIG. 1A and FIG. 1B are illustrated in more detail. Elements of FIG. 1C, FIG. 1B, and FIG. 1A having identical element identifiers are identical elements. As with FIG. 1A and FIG. 1B, for clarity, FIG. 1C is simplified.

Each of the 2D (search) engines comprises a respective bit line. In particular, 2D (search) Engine_0 150, 2D (search) Engine_128K-2 158, and 2D (search) Engine_128K-1 159 respectively comprise BL_0 140, BL_128K-2 148, and BL_128K-1 149. Note that in FIG. 1A, the bit lines are collectively referred to as Match Lines 9040, as each bit line is usable to indicate a match between search and stored information. Each 2D (search) engine comprises a plurality of memory strings (e.g., 512 memory strings). For clarity, four of the memory strings are illustrated. Each memory string is selectively coupled to the bit line of the 2D (search) engine via a transistor controlled by a respective SSL input. The transistor and the SSL input collectively enable selectively enabling (disabling) the memory string based on activation (deactivation) of the SSL input. Each SSL input is coupled to a memory string of each of the 2D (search) engines. Thus, each SSL input enables selectively enabling (disabling) a block of the memory strings based on activation (deactivation) of the SSL input.

For instance, SSL0 170 is enabled to selectively couple a 1st memory string of 2D (search) Engine_0 150 to BL_0 140, a 1st memory string of 2D (search) Engine_128K-2 158 to BL_128K-2 148, and a 1st memory string of 2D (search) Engine_128K-1 159 to BL_128K-1 149, each via a respective transistor. SSL0 170 is also enabled to selectively couple 128K-3 1st memory strings (not illustrated) of the 2D (search) engines between 2D (search) Engine_0 150 and 2D (search) Engine_128K-2 158 respectively to the bit lines therein via respective transistors.

For another instance, SSL511 179 is enabled to selectively couple a 512th memory string of 2D (search) Engine_0 150 to BL_0 140, a 512th memory string of 2D (search) Engine_128K-2 158 to BL_128K-2 148, and a 512th memory string of 2D (search) Engine_128K-1 159 to BL_128K-1 149, each via a respective transistor. SSL511 179 is also enabled to selectively couple 128K-3 512th memory strings (not illustrated) of the 2D (search) engines between 2D (search) Engine_0 150 and 2D (search) Engine_128K-2 158 respectively to the bit lines therein via respective transistors.

Similar to the bit lines, each of the 2D (search) engines comprises a respective source line (illustrated but for clarity not identified). Each memory string is selectively coupled to the source line of the 2D (search) engine via a transistor controlled by a respective GSL input.

Again similar to the bit lines, for instance, GSL0 160 is enabled to selectively couple the 1st memory string of 2D (search) Engine_0 150 to a source line of 2D (search) Engine_0 150, the 1st memory string of 2D (search) Engine_128K-2 158 to a source line of 2D (search) Engine_128K-2 158, and the 1st memory string of 2D (search) Engine_128K-1 159 to a source line of 2D (search) Engine_128K-1 159, each via a respective transistor. GSL0 160 is also enabled to selectively couple 128K-3 1st memory strings (not illustrated) of the 2D (search) engines between 2D (search) Engine_0 150 and 2D (search) Engine_128K-2 158 respectively to source lines therein via respective transistors. The source lines are all connected to ground.

Again similar to the bit lines, for another instance, GSL511 169 is enabled to selectively couple a 512th memory string of 2D (search) Engine_0 150 to the source line of 2D (search) Engine_0 150, a 512th memory string of 2D (search) Engine_128K-2 158 to the source line of 2D (search) Engine_128K-2 158, and a 512th memory string of 2D (search) Engine_128K-1 159 to the source line of 2D (search) Engine_128K-1 159, each via a respective transistor. GSL511 169 is also enabled to selectively couple 128K-3 512th memory strings (not illustrated) of the 2D (search) engines between 2D (search) Engine_0 150 and 2D (search) Engine_128K-2 158 respectively to the source lines therein via respective transistors.

The SSL and GSL inputs are coupled in parallel to corresponding transistors in each of a corresponding memory string in each of the 2D (search) engines. As there are 512 memory strings in each of the 2D (search) engines, there are 512 SSL inputs and 512 GSL inputs. Note that in FIG. 1C, the coupling between GSL0 160 and a transistor of 2D (search) Engine_128K-1 159 is omitted for clarity, although a dotted-line extension of GSL0 160 is illustrated.

In 3D Engine 9000, each of the memory strings is a same length of 128 floating-gate transistors (excluding the transistors that couple each memory string to a bit line and a source line). In a planar integrated circuit process implementation of 3D Engine 9000, a certain number of layers are used to implement the memory strings. As the length of the memory strings increases, so does the number of layers used to implement the memory strings. Thus, doubling the length of the memory strings doubles the layers used to implement the memory strings.

Turning now to word lines, conceptually each 2D (search) engine is coupled to a same 2D array of word lines. In the X dimension, there are 512 columns of word lines, corresponding one-to-one with each of the 512 memory strings. In the Z dimension, there are 128 rows of word lines, corresponding one-to-one with the floating-gate transistors of each of the memory strings. Thus, the 2D array of word lines is 512 columns by 128 rows or 512*128individual word lines. Each word line couples to a single floating-gate transistor of a single memory string in each of the 2D (search) engines. Note that in FIG. 1C, the coupling between WL0_0 100 and a floating-gate transistor of 2D (search) Engine_128K-1 159 is omitted for clarity, although a dotted-line extension of WL0_0 100 is illustrated.

For instance, WL0_0 100 couples to a floating-gate transistor of the 1st memory string of 2D (search) Engine_0 150, a floating-gate transistor of the 1st memory string of 2D (search) Engine_128K-2 158, and a floating-gate transistor of the 1st memory string of 2D (search) Engine_128K-1 159. WL0_0 100 also couples to a floating-gate transistor in each of the 128K-3 1st memory strings (not illustrated) of the 2D (search) engines between 2D (search) Engine_0 150 and 2D (search) Engine_128K-2 158.

For another instance, WL0_511 109 couples to a floating-gate transistor of the 512th memory string of 2D (search) Engine_0 150, a floating-gate transistor of the 512th memory string of 2D (search) Engine_128K-2 158, and a floating-gate transistor of the 512th memory string of 2D (search) Engine_128K-1 159. WL0_511 109 also couples to a floating-gate transistor in each of the 128K-3 512th memory strings (not illustrated) of the 2D (search) engines between 2D (search) Engine_0 150 and 2D (search) Engine_128K-2 158.

In this description, word lines are sometimes referred to in a 2D context by a block number and a layer number. Conceptually a block exists in the Y and Z dimensions and a layer exists in the X and Y dimensions. Conceptually the block number corresponds to the column number and the layer number corresponds to a row number.

A block corresponds to memory strings from each of the 2D (search) engines. As a specific example, the memory strings coupled between GSL511 169 and SSL511 179 correspond to block number 511. As another specific example, the memory strings coupled between GSL0 160 and SSL0 170 correspond to block number 0.

A layer corresponds to floating-gate transistors from each of the memory strings of all the 2D (search) engines. As a specific example, the floating-gate transistors coupled to WL0_511 109 and WL0_0 100 are part of layer number 0. As another specific example, the floating-gate transistors coupled to WL1_511 119 are part of layer number 1. Similarly, the floating-gate transistors respectively coupled to WL2_511 129, WL126_0 180, and WL127_0 190 are respectively part of layer numbers 2, 3, 126, and 127. Layers also correspond to layers with respect to planar integrated circuit process, although a layer of floating-gate transistors corresponds to one or more planar integrated circuit process layers.

Thus, word lines are identifiable in the Z and X dimensions respectively as "WL" "<layer number>" and "<block number>". Thus, WL0_0 100 is of layer number 0 and block number 0. WL0_511 109 is of layer number 0 and block number 511.

Figure 1D:
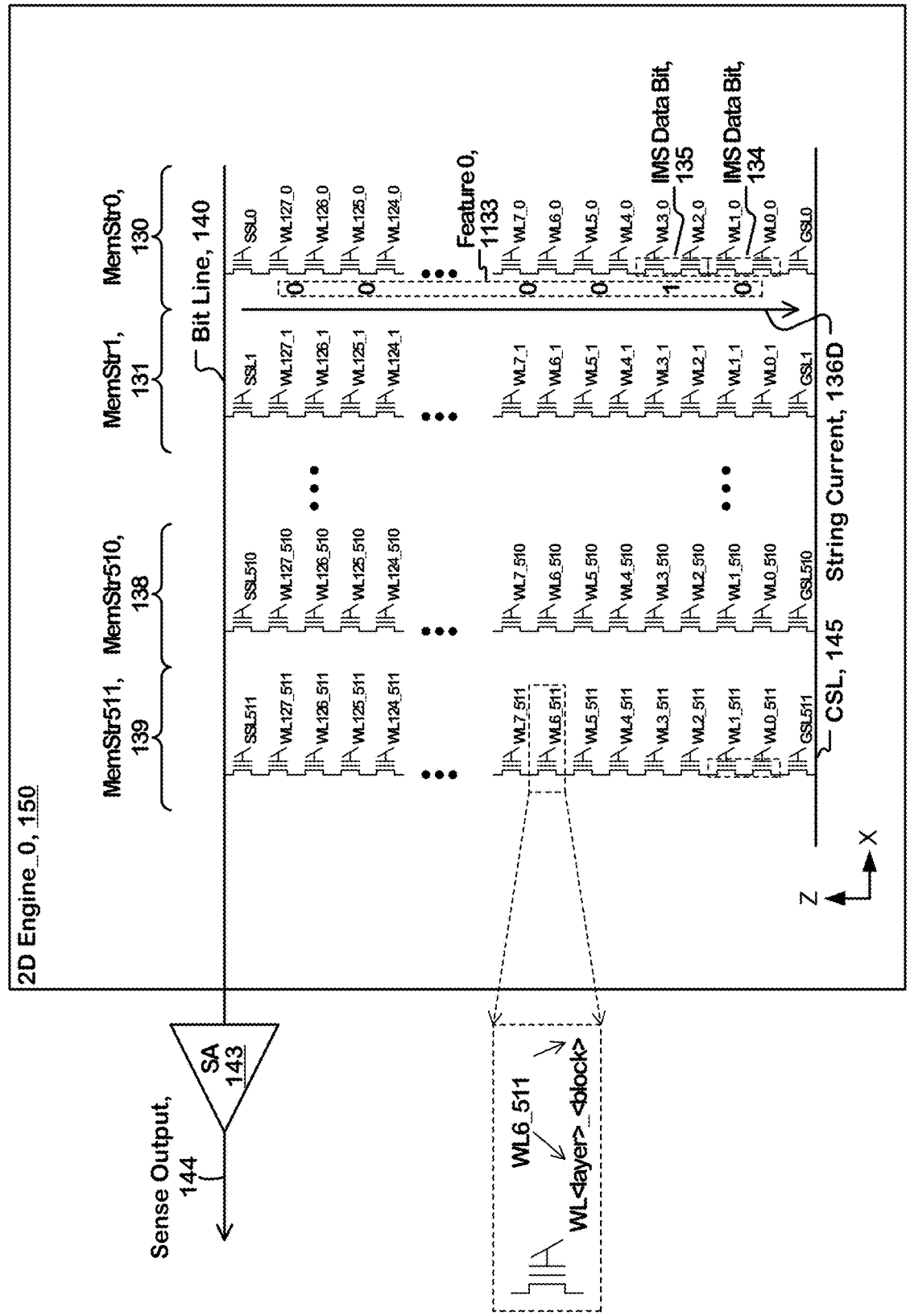
FIG. 1D illustrates an example 2D (search) engine and use thereof.

FIG. 1D illustrates 2D (search) Engine_0 150 in the context of portions of FIG. 1A and FIG. 1B. Numerous word lines are illustrated and identified in the aforementioned "WL" "<layer number>" and "<block number>" scheme, as illustrated by the icon near WL6_511. 2D (search) Engine_0 150 comprises 512 memory strings. For clarity, four of the memory strings are illustrated (MemStr0 130, MemStr1 131, MemStr510 138, and MemStr511 139). The floating-gate transistors of each of the memory strings are arranged and operated in pairs. An example of one of the pairs is IMS Data Bit 134. Another example is IMS Data Bit 135. Conceptually, each of the even-layer-numbered word lines is coupled to one of the floating-gate transistors of the pairs. E.g., WL0_0, WL0_1 . . . WL0_510, and WL0_511 of layer 0 are each coupled to a respective one of the pairs, as are WL2_0. . . WL2_511 of layer 2, and so forth, to WL126_0. . . . WL126_511 of layer 126. Further, each of the odd-layer-number word lines are coupled to the other one of the floating-gate transistors of the pairs. E.g., WL1_0, WL1_1 . . . WL1_510, and WL1_511 of layer 1 are coupled respectively to the other floating-gate transistors of the pairs that WL0_0, WL0_1 . . . WL0_510, and WL0_511 of layer 0 are respectively coupled to.

FIG. 1D also illustrates a specific usage example of a 2D (search) engine.

Each memory string is usable to store a feature. Thus, the 512 memory strings of 2D (search) Engine_0 150 are collectively usable to store up to 512 features. For clarity, one of the features is illustrated as Feature 0 1133. Each of the pairs of floating-gate transistors is usable to store a single bit of one of the features. There are 64 pairs of floating-gate transistors in each of the memory strings. Thus, each of the memory strings is usable to store a feature of up to 64 bits.

Each memory string is usable to compare the feature stored therein with a search input supplied via the word lines coupled to the memory string. Each floating-gate transistor of the memory string is responsive to word line voltage according to the feature bit stored by the floating-gate transistor (e.g., the threshold voltage of the floating-gate transistor configured by programming). For example, operated in pairs, a pair of the floating-gate transistors indicates a match to a search input provided to the pair of floating-gate transistors via a pair of word lines via a match-found impedance (e.g., a relatively low impedance). The pair indicates lack of a match via a no-match-found impedance (e.g., a relatively high impedance). Thus, across an entirety of a memory string, responsive to all pairs of floating-gate transistor stored feature bits matching a multi-bit search input as provided via corresponding pairs of word lines, the entirety of the memory string indicates a corresponding memory string match-found impedance. Responsive to less than all pairs matching, the entirety of the memory string indicates a corresponding memory string impedance that is greater than the memory string match-found impedance. Responsive to no pairs matching, the entirety of the memory string indicates a corresponding memory string no-match-found impedance. In between all bits matching and no bits matching extremes, the memory string indicates a corresponding memory string impedance that monotonically decreases (increases) as correspondingly more (less) stored feature bits that match bit-for-bit compared to applied word line inputs. String Current 136D indicates current flow in the memory string as based on the indicated memory string impedance.

For example, MemStr0 130 is coupled to BL_0 140 via activation of SSL0 and coupled to CSL 145 via activation of GSL0. Feature 0 1133 stored in MemStr0 130 is programmed to all zero bits except for a single one bit in the floating-gate transistor pair of IMS Data Bit 135.

Consider a first operating scenario with respect to the example, with all word line pairs coupled to MemStr0 130 (WL0_0, WL1_0 . . . WL126_0, and WL127_0) indicating in pairs a search for all zero bits. In response, all floating-gate transistor pairs of MemStr0 130, except for the pair of IMS Data Bit 135, indicate the match-found impedance. The pair of IMS Data Bit 135 indicates the no-match-found impedance (since there is no match between the word line search input and the stored feature bits). Thus, MemStr0 130 overall indicates an impedance that is greater than the memory string match-found impedance. SA 143 senses that the impedance is greater than the memory string match-found impedance and indicates, via Sense Output 144, that there is not a match between the word line pairs and Feature 0 1133.

Consider a second operating scenario with respect to the example, with the word line pair coupled to IMS Data Bit 135 (WL2_0 and WL3_0) indicating a search for a one bit and the remainder of the word line pairs coupled to MemStr0 130 (WL0_0, WL1_0, WL4_0, WL5_0. . . . WL126_0, and WL127_0) indicating in pairs a search for zero bits. In response, all floating-gate transistor pairs of MemStr0 130, including the pair of IMS Data Bit 135, indicate the match-found impedance. Thus, MemStr0 130 overall indicates an impedance that is equal to the memory string match-found impedance. SA 143 senses that the impedance is the memory string match-found impedance and indicates, via Sense Output 144, that there is a match between the word line pairs and Feature 0 1133.

SA 143 performs the sensing and generates Sense Output 144, e.g., by detecting a voltage change greater than (or lesser than) a predetermined sense threshold on BL_0 140 within a sensing time interval. In some variations, the voltage change is due to MemStr0 130 discharging a pre-charged value on BL_0 140 in accordance with the indicated memory string impedance. Responsive to the first operating scenario, where the impedance is greater than the memory string match-found impedance, BL_0 140 is discharged by MemStr0 130 more slowly than compared to the second operating scenario, where the impedance is equal to the memory string match-found impedance. The sense threshold and/or the sensing time interval are set to enable distinguishing between the match-found and other than the match-found impedance based on sense speed (e.g., engine bandwidth and/or latency) and noise immunity (e.g., engine resilience).

For either the first or the second operating scenarios, and continuing in the context of FIG. 1A, FIG. 1B, and FIG. 1C, Sense Output 144 is provided to Page Buffer, Cache, Priority Encoder 9008 along with corresponding sense amplifier information of the other 2D engines. Page Buffer, Cache, Priority Encoder 9008 buffers, caches, and/or priority encodes Sense Output 144 in the context of the entirety of the 2D engine sense outputs.

In some applications, a controller activates multiple blocks of 2D (search) engines to enable searching the multiple blocks concurrently. For example, a plurality of SSL inputs is activated in a same search operation to search multiple blocks during the same search operation.

For instance, the controller activates SSL_511 and SSL_510 in a same search operation to enable searching two blocks concurrently in each of the 128K 2D (search) engines, 2D (search) Engine_0 150 . . . 2D (search) Engine_128K-2 158, and 2D (search) Engine_128K-1 159. Thus, the controller enables 3D Engine 9000 to search 2*128K blocks concurrently. Alternatively, the controller activates any two SLL inputs in a same search operation to enable searching any two blocks concurrently. For other instances, the controller activates any four, six, 8, 32, 64, 128, 256, or 512 SSL inputs in a same search operation to enable searching corresponding multiple blocks concurrently. For example, the controller activates all 512 SSL inputs in a same search operation. Thus, the controller enables 3D Engine 9000 to search 512 blocks concurrently, comprising 512*128K memory strings. Optionally, the controller is responsive to a control register that specifies if and to what extent multiple blocks are searched concurrently.

FIG. 1A, FIG. 1B, and FIG. 1C illustrate an example 3D (search) engine as having a particular number of 2D (search) engines, each of which have a particular number of memory strings, each of which have a particular number of IMS data bits (each as a respective pair of floating-gate transistors). Specifically, 3D Engine 9000 has 128K 2D (search) engines, (2D (search) Engine_0 150 . . . 2D (search) Engine_128K-1 159), but some variations have less or more 2D (search) engines. Each 2D (search) engine has 512 memory strings (e.g., MemStr0 130. . . . MemStr511 139), but some variations have less or more memory strings. Each memory string has 64 IMS data bits (e.g., coupled to word line pairs WL0_1 and WL1_0 . . . WL126_0 and WL 127_0), but some variations have less or more IMS data bits per memory string.

Some variations of 2D (search) engine and associated sense amplifier circuitry enable sense amplifier resolution of a single bit (e.g., match/no-match). Some variations enable sense amplifier resolution of a plurality of bits (e.g., to encode no matches, one match, or two or more matches). Some variations enable sense amplifier indications that are analog rather than digital. For example, a sense amplifier output is a monotonically increasing function based on memory string current, and the memory string current is a monotonically increasing (or decreasing) indicator of similarity between search inputs and stored features.

Some variations of 3D (search) engines enable identifying at most one feature (stored in a single memory string) as matching for a search. Some variations enable concurrently identifying at most a plurality of features (stored in a plurality of memory strings) as matching for a search. Some variations enable concurrently identifying at most one 2D (search) engine as having one or more features stored therein as matching for a search. Some variations enable concurrently identifying a plurality of 2D (search) engines each as having one or more features stored therein as matching for a search.

Some variations of 3D (search) engines enable priority encoding match indications according to predetermined 2D (search) engine priority (e.g., a predetermined 2D (search) engine is a lowest priority and a another predetermined 2D (search) engine is a highest priority). Thus, a match indication from the predetermined highest priority 2D (search) engine corresponds to a highest priority match. Further, a match indication from a predetermined second highest priority 2D (search) engine corresponds to a second highest priority match. Some variations enable priority encoding according to how many stored feature bits within a memory string match respective search input bits (e.g., zero match, one matches, two match, or three or more match). Thus, a highest priority match corresponds to a highest number of stored feature bits within a memory string matching respective search input bits, and a second highest priority match corresponds to a second highest number of stored feature bits within a memory string matching respective search input bits. Some variations enable priority encoding according to how many memory strings match within a particular 2D (search) engine (e.g., zero match, one matches, two match, or three or more match). Thus, a highest priority match corresponds to a highest number of memory strings matching within a particular 2D (search) engine, and a second highest priority march corresponds to a second highest number of memory strings matching within a particular 2D (search) engine.

Some variations enable priority encoding that identifies a single matching stored feature. Some variations enable priority encoding that identifies a plurality of matching stored features. Some variations enable priority encoding that identifies a single "best matching" stored feature, having, e.g., a highest number of stored feature bits matching a search, and the highest number is less than a maximum stored feature length. Some variations enable priority encoding that identifies a plurality of "best matching" stored features, ranked, e.g., according to number of stored feature bits matching a search for each of a plurality of stored features.

In various usage scenarios (e.g., due to features programmed into the 2D (search) engines, provided search information, and/or encodings thereof), various numbers of 2D (search) engines of a 3D (search) engine detect a match between one or more features stored in one or more of the memory strings of the 2D (search) engines and the search information provided to the 2D (search) engines of the 3D (search) engine.

In some usage scenarios, zero, one, or more memory strings of a 2D (search) engine detect matches, and sense amplifier circuitry encodes matching results as a plurality of bits. For example, the sense amplifier circuitry encodes zero memory strings matching, one memory string matching, two memory strings matching, and more than two memory strings matching as four mutually exclusive encodings. Some variations enable priority encoding according to one or more factors, such as 2D (search) engine priority, number of matching stored feature bits, number of memory strings (e.g., features).

For example, responsive to no matches from any of 2D (search) Engine_0 150 . . . 2D (search) Engine_128K-1 159, SAs 9007 provides a vector of all zeros to Page Buffer, Cache, Priority Encoder 9008. In response, Page Buffer, Cache, Priority Encoder 9008 priority encodes the all zero vector to a binary value indicating zero matches and provides the binary value via Output Matching Result(s) 9009.

Continuing with the example, responsive to a single memory string of 2D (search) Engine_0 150 detecting a match, SAs 9007 provides a vector with an LSB corresponding to 2D (search) Engine_0 150 as a one and all other bits as zeros. In response, Page Buffer, Cache, Priority Encoder 9008 encodes the vector to a non-zero binary value identifying 2D (search) Engine_0 150 as having the matching memory string.

Continuing with the example, responsive to a plurality of memory strings of 2D (search) Engine_0 150 detecting matches as well as a single memory string of 2D (search) Engine_128K-2 158 detecting a match, SAs 9007 provides a vector with a bit corresponding to 2D (search) Engine_0 150 as a one, another bit corresponding to 2D (search) Engine_128K-2 158 as a one, and all other bits as zeros. In response, Page Buffer, Cache, Priority Encoder 9008 encodes the vector to a non-zero binary value identifying 2D (search) Engine_128K-2 158 as having the highest-priority matching memory string.

3D (Search) Engine Encoding

Searching, comparing, and/or sorting as performed by a 3D (search) engine is according to a selected feature encoding (for feature storage in memory strings of the 3D (search) engine) and a selected search encoding (for searching performed by the memory strings). The feature and search encodings are selected in conjunction with each other, as matching performed by the memory strings is in the context of the encoding selected for the feature storage.

Example encodings usable in 3D (search) engines for storing features and/or performing searches include expansion encoding, one-hot encoding, low effect encoding (conceptually a variation of expansion encoding that enables reduced pattern and body effects), and reverse expansion encoding.

Figure 1E:
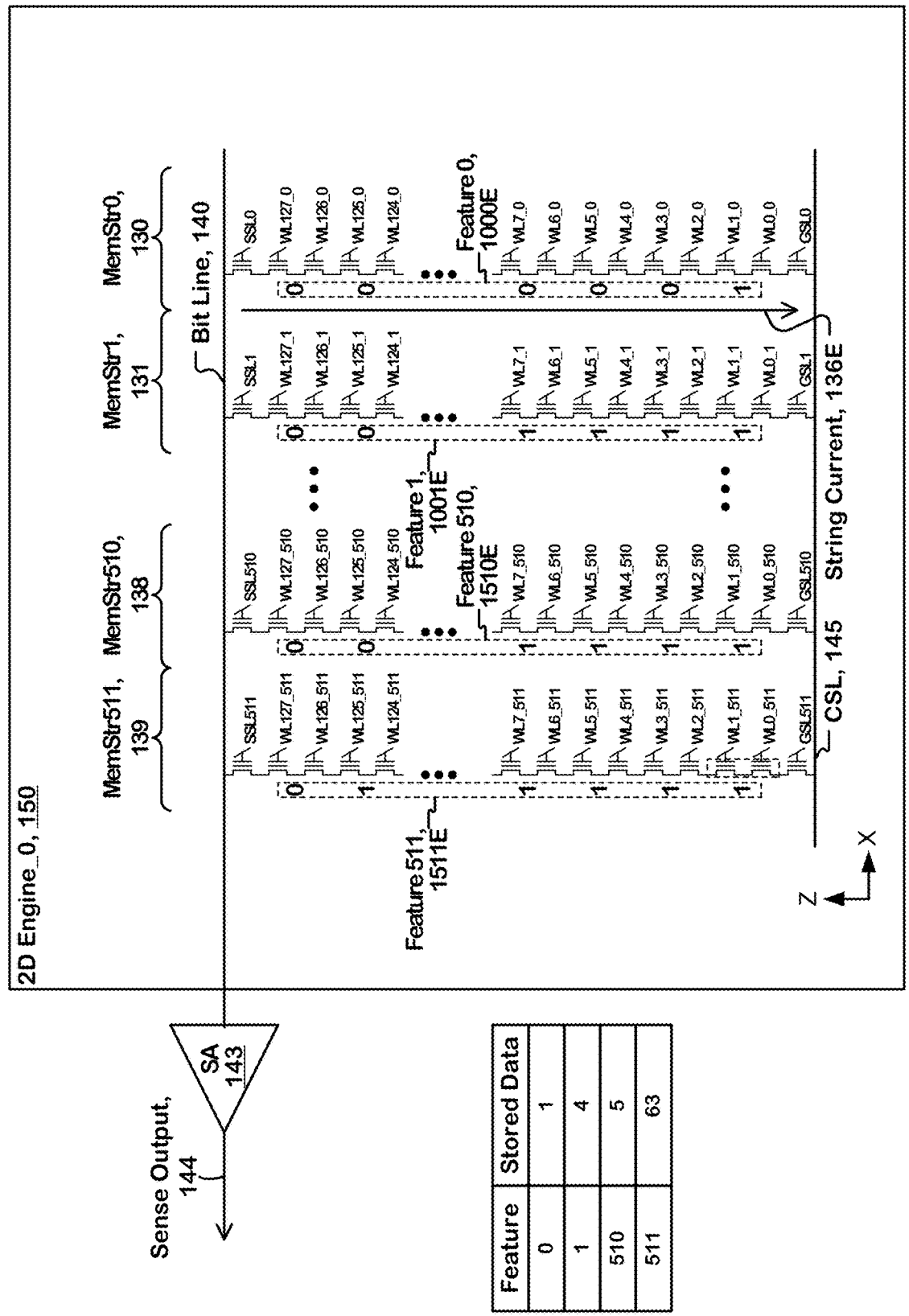
FIG. 1E illustrates an expansion encoding usage example of a 2D (search) engine of a 3D (search) engine.
Figure 1F:
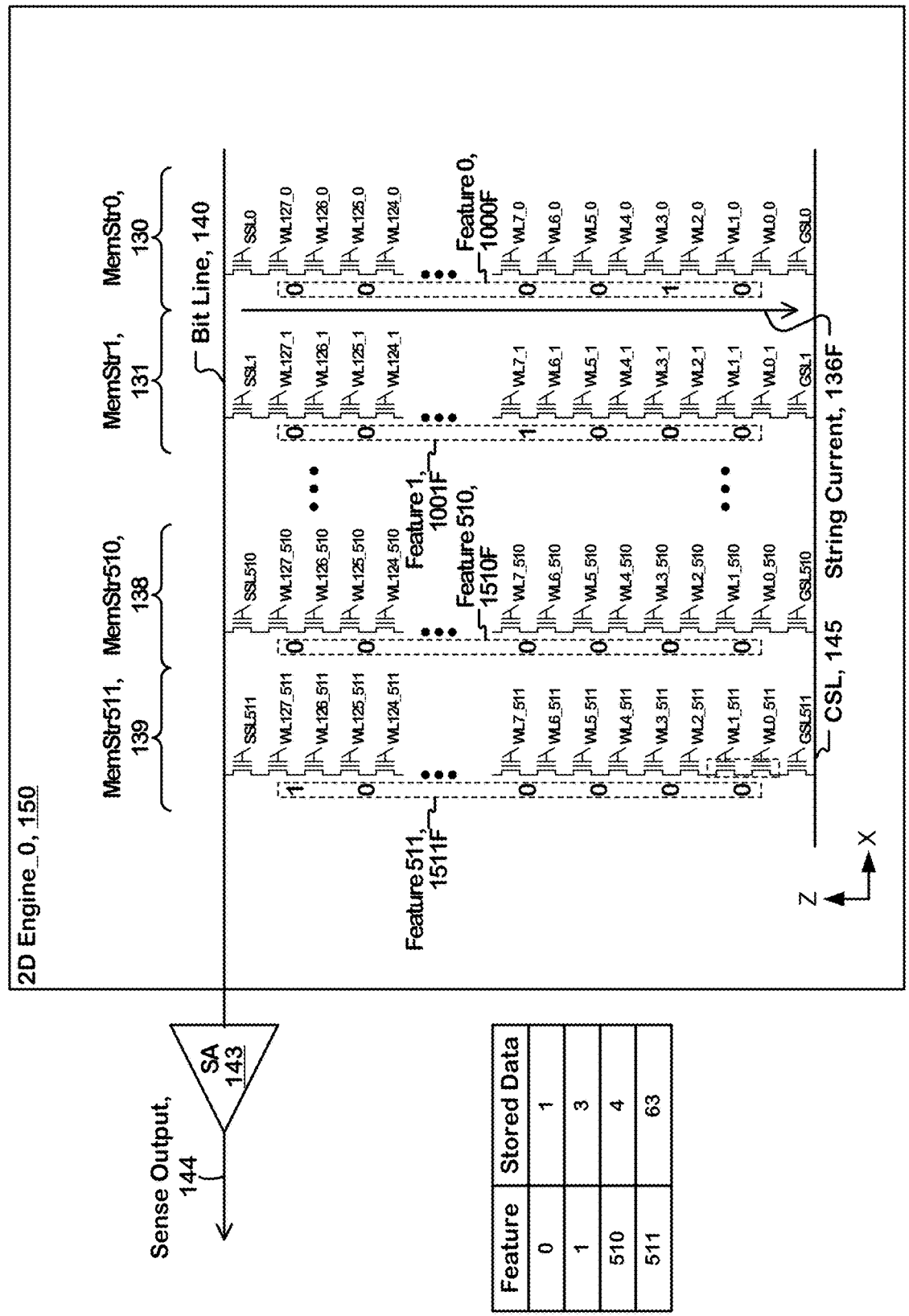
FIG. 1F illustrates a one-hot encoding usage example of a 2D (search) engine of a 3D (search) engine.

As a brief introduction, FIG. 1E and FIG. 1F respectively illustrate expansion encoding and one-hot encoding usage examples in a context of 2D (search) Engine_0 150, in a similar style as FIG. 1D. Correspondingly, FIG. 2 and FIG. 3 respectively illustrate expansion encoding and one-hot encoding examples.

3D (Search) Engine Expansion Encoding

Turning first to expansion encoding, an N-bit binary value (either a feature or a search) is encoded in a $2^N$ bit field. The encoding produces two contiguous fields of bits. Each of the contiguous fields is a repeat of either a one or a zero. Thus, $2^N-1$ is encoded as a single leading zero and the remainder all ones. The number of ones is equal to the value being encoded. As a special case, a zero is encoded as all zeros. Thus, the most-significant bit is always zero. Therefore, in some variations, the most-significant bit is not implemented.

FIG. 2 illustrates an example expansion encoding for a 3D (search) engine. There are two columns in a table. The first column, Value 251, is a 6-bit binary value to be encoded according to expansion encoding. The second column, Expansion Encoding 252, is a 64-bit binary expansion encoding of the corresponding binary value from the first column. For readability, the 64-bit values are separated every four bits by an underscore ("_") character. For brevity, the table omits some values.

FIG. 1E illustrates an expansion encoding usage example of a 2D (search) engine of a 3D (search) engine, specifically 2D (search) Engine_0 150 of FIG. 1D. Elements of FIG. 1E and FIG. 1D having identical element identifiers are identical elements.

Four example features encoded according to the expansion encoding of FIG. 2 are summarized in a table in the left-hand portion of FIG. 1E. In particular, MemStr0 130 is programmed to store Feature 0 1000E with an expansion encoding of 1 (a single one bit and 63 zero bits). Each feature bit is stored in a series pair of memory devices. The feature expansion encoding is performed by Feature Encoder 9003 of FIG. 1A. MemStr1 131 is programmed to store Feature 1 1001E with an expansion encoding of 4 (four one bits and 60 zero bits). Features 2-509 are programmed to store expansion encodings of various values not specifically discussed. MemStr510 138 is programmed to store Feature 510 1510E with an expansion encoding of 5 (five one bits, four of which are illustrated, and 59 zero bits). MemStr511 139 is programmed to store Feature 511 1511E with an expansion encoding of 63 (63 one bits and a single zero bit).

In the illustrated usage scenario, searches are also encoded according to the expansion encoding of FIG. 2. The search expansion encoding is performed by Search Encoder 9005 of FIG. 1A. A search for the value 1 is encoded on pairs of word lines as a search for a single one bit and 63 zero bits. Assuming the search is in block 0, the pairs of word lines used for the search are WL0_0, WL1_0 . . . WL126_0, and WL127_0. Responsive to the expansion encoding of 63 presented on the word lines of block zero, MemStr0 130 enables a current flow as indicated by String Current 136E. The current flow indicates a match as sensed by SA 143 and presented on Sense Output 144 for further processing.

Responsive to none of the stored features matching any of the corresponding search inputs, the current flow indicates no match, as sensed by SA 143, and presented on Sense Output 144 for further processing.

Expansion encoding is usable for approximate matching between searches and stored features. A best match (e.g., high similarity) has a highest memory string current (e.g., lowest impedance). A worst match (e.g., low similarity) has a lowest memory string current (e.g., highest impedance). A number of bits matched (or mismatched) is determinable by measurement of memory string current and/or impedance.

Example search expansion encoding resolutions include 4 bits implemented using 32 3D-NAND layers, 5 bits using 64 3D-NAND layers, 6 bits using 128 3D-NAND layers, 7 bits using 256 3D-NAND layers, and 8 bits using 512 3D-NAND layers. Thus, resolution increases by one bit as the number of 3D-NAND layers is doubled.

3D (Search) Engine One-Hot Encoding

Turning next to one-hot encoding, an N-bit binary value (either a feature or a search) is encoded in a $2^N$ field. The encoding produces a single one bit with all other bits zeros. The single one bit is in a bit position that corresponds to the value being encoded.

FIG. 3 illustrates an example one-hot encoding for a 3D (search) engine, as a table. There are two columns in the table. The first column, Value 351, is a 6-bit binary value to be encoded according to one-hot encoding. The second column, One-Hot Encoding 352, is a 64-bit binary one-hot encoding of the corresponding binary value from the first column. For readability, the 64-bit values are separated every four bits by an underscore ("_") character. For brevity, the table omits some values.

FIG. 1F illustrates a one-hot encoding usage example of a 2D (search) engine of a 3D (search) engine, specifically 2D (search) Engine_0 150 of FIG. 1D. Elements of FIG. 1F and FIG. 1D having identical element identifiers are identical elements.

Four example features encoded according to the one-hot encoding of FIG. 3 are summarized in a table in the left-hand portion of FIG. 1F. In particular, MemStr0 130 is programmed to store Feature 0 1000F with a one-hot encoding of 1 (a single one bit in bit position 1 and 63 zero bits elsewhere). Each feature bit is stored in a series pair of memory devices. The feature one-hot encoding is performed by Feature Encoder 9003 of FIG. 1A. MemStr1 131 is programmed to store Feature 1 1001F with a one-hot encoding of 3 (a single one bit in bit position 3 and 63 zero bits elsewhere). Features 2-509 are programmed to store one-hot encodings of various values not specifically discussed. MemStr510 138 is programmed to store Feature 510 1510F with a one-hot encoding of 4 (a single one bit in bit position 4 and 63 zero bits elsewhere). MemStr511 139 is programmed to store Feature 511 1511F with a one-hot encoding of 63 (a single one bit in bit position 63, the most-significant bit, and 63 zero bits elsewhere).

In the illustrated usage scenario, searches are also encoded according to the one-hot encoding of FIG. 3. The search one-hot encoding is performed by Search Encoder 9005 of FIG. 1A. A search for the value 1 is encoded on pairs of word lines as a search for a single one bit in bit position 1 and 63 zero bits. Assuming the search is in block 0, the pairs of word lines used for the search are WL0_0, WL1_0 . . . WL126_0, and WL127_0. Responsive to the one-hot encoding of 1 presented on the word lines of block zero, MemStr0 130 enables a current flow as indicated by String Current 136F. The current flow indicates a match as sensed by SA 143 and presented on Sense Output 144 for further processing.

Responsive to none of the stored features matching any of the corresponding search inputs, the current flow indicates no match, as sensed by SA 143, and presented on Sense Output 144 for further processing.

3D (Search) Engine Low Effect Encoding

Turning next to low effect encoding, the encoding is a variation on expansion encoding that enables reduced pattern effects and reduced body effect of the floating-gate transistors in memory strings. Conceptually, floating-gate transistors and corresponding word lines are rearranged so that floating-gate transistors programmed at a same threshold voltage tend to be contiguous with each other within a memory string. This is accomplished without actually moving transistors around but by altering the expansion encoding.

Figure 4A:
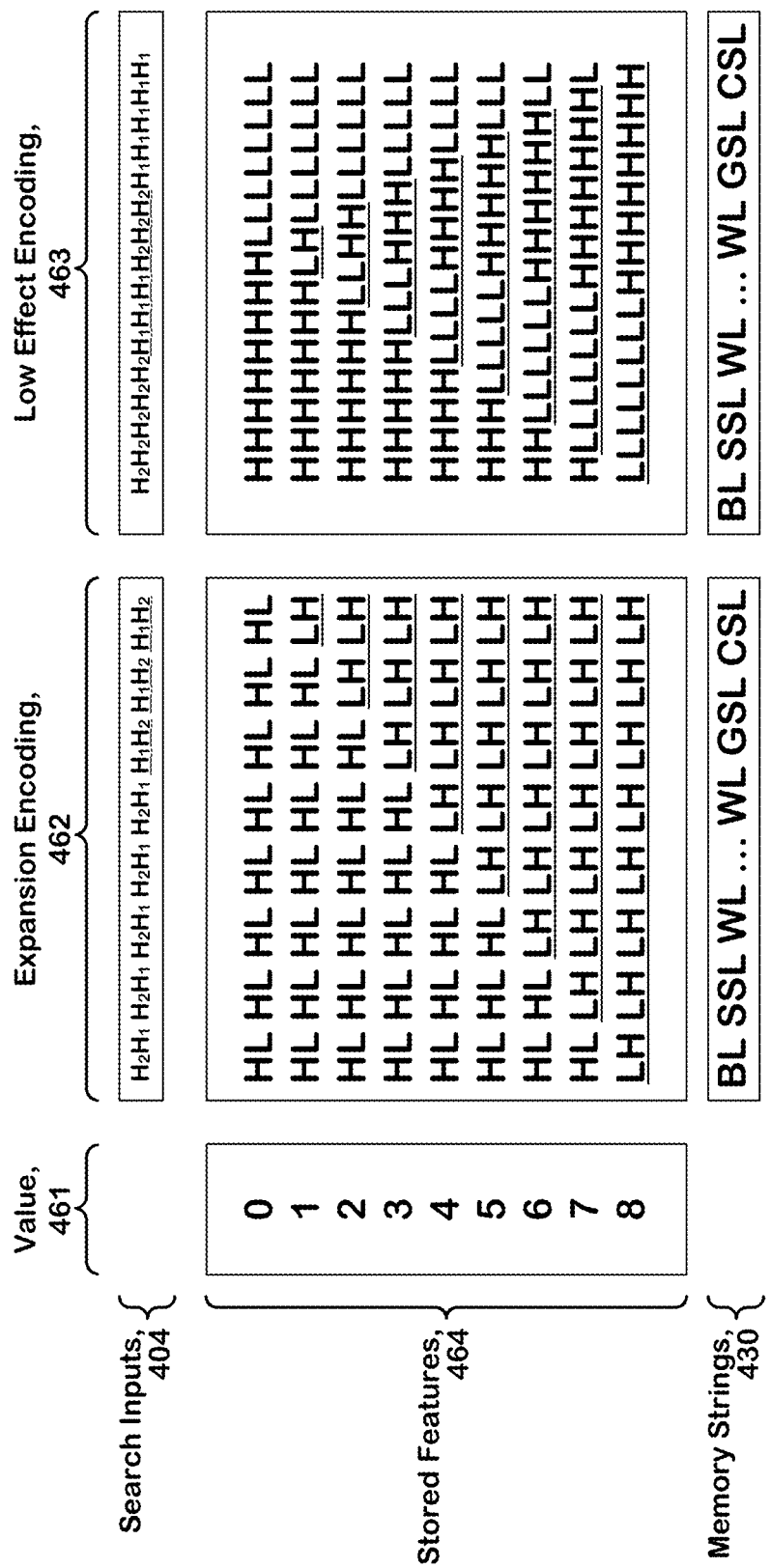
FIG. 4A illustrates an example expansion encoding and a corresponding example low effect encoding.

FIG. 4A illustrates an example expansion encoding and a corresponding example low effect encoding. For brevity, the examples are with respect to memory strings of 16 floating-gate transistors and correspondingly 16 word lines.

There are three columns arranged in a tabular fashion. The first column, Value 461, is a binary value to be encoded. The second column, Expansion Encoding 462, is an 8-bit expansion encoding of the value from the first column. The third column, Low Effect Encoding 463, is an equivalent 8-bit low effect encoding of the value from the first column.

The table has three sections of rows. The first section, Search Inputs 404, is a single row representing respective encodings of a same search value of 3. The second section, Stored Features 464, has nine rows each representing a respective stored feature value according to one of the expansion encoding or the low effect encoding. The third section, Memory Strings 430, indicates memory strings that progress from left to right respectively starting from a bit line "BL" through a string select line "SSL" through a plurality of word lines "WL . . . WL", through a ground select line "GSL" and ending at a current source line "CSL".

The "HL" entries in Expansion Encoding 462 correspond to a data bit of one, and the "LH" entries correspond to a data bit of zero. Each "H" or "L" character corresponds to a threshold voltage of a floating-gate transistor. The "H" entries in Stored Features 464 correspond to a "high" threshold voltage, and the "L" entries correspond to a "low" threshold voltage. The H2 and H1 entries in Search Inputs 404 correspond to two respective word line voltages. The particular search input is illustrated as 3. The underlining in Expansion Encoding 462 and Low Effect Encoding 463 serves to indicate the conceptual rearrangement of the floating-gate transistors and the corresponding word lines.

FIG. 4B illustrates an example expansion encoding with Hamming distances compared to an input of 1. The input of 1 corresponds to a search input of 1 and is illustrated encoded according to expansion encoding as Input 450. The example encoding is that of FIG. 2. There are three columns in a table. The first column, Value 451, is a 6-bit binary value to be encoded according to expansion encoding. The second column, Expansion Encoding 452, is a 64-bit binary expansion encoding of the corresponding binary value from the first column. The third column, HD 453, is the Hamming distance between the respective expansion encoding and the expansion encoding of search input of 1 (Input 450). The Hamming distance is a minimum (0) when the input matches the stored value. The Hamming distance is a maximum (62)

when the input mismatches nearly all the bits of the stored value. For readability, the 64-bit values are separated every four bits by an underscore ("_") character. For brevity, the table omits some values.

Figure 4C:
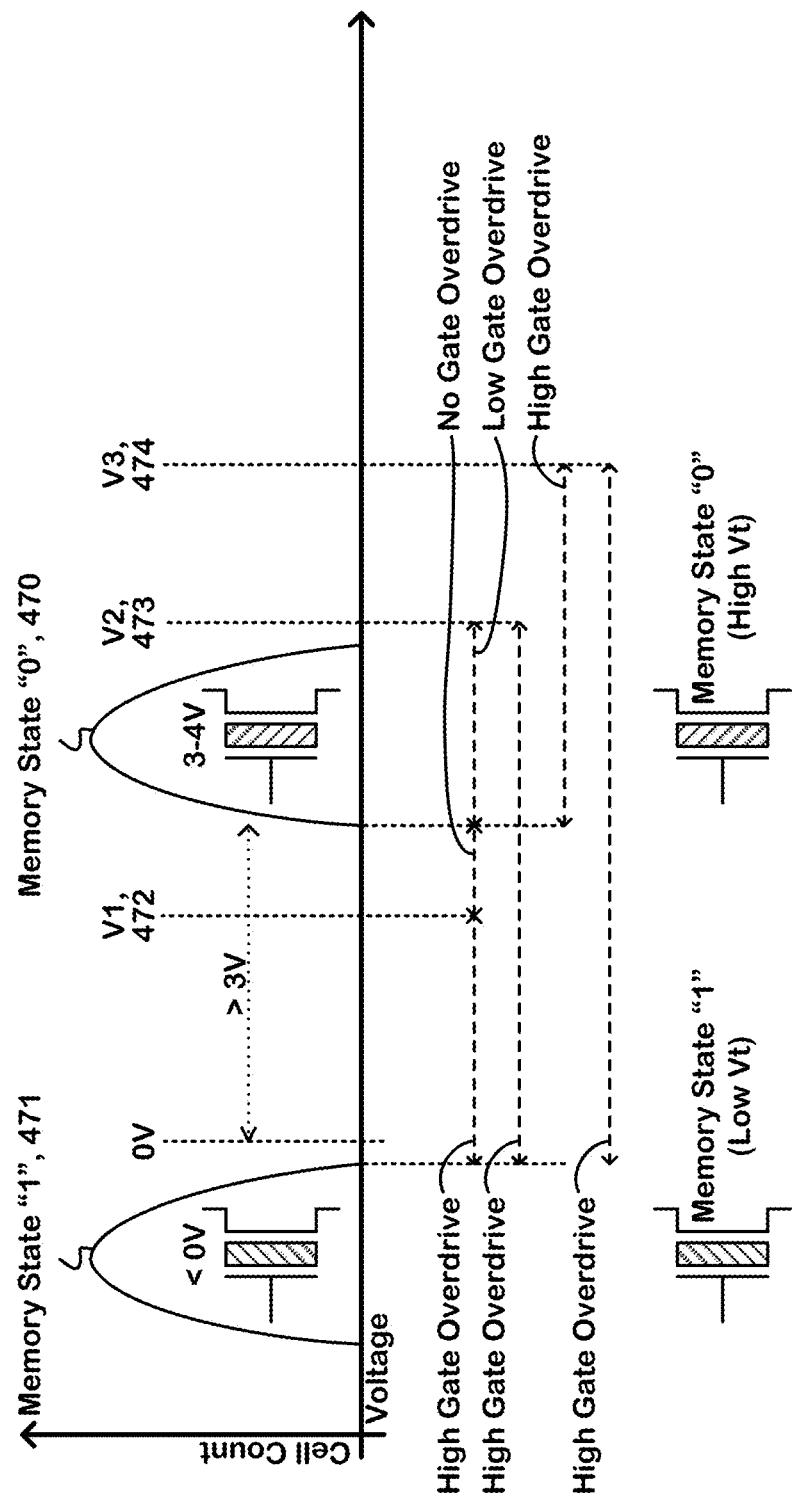
FIG. 4C illustrates example threshold voltages and word line voltages that enable comparing of ones, zeros, and don't cares.

FIG. 4C illustrates example threshold voltages and word line voltages that enable comparing of ones, zeros, and don't cares. The left portion of the figure represents memory state "1" cells, as Memory State "1" 471. The right portion of the figure represents memory state "0" cells, as Memory State "0" 470. The figure represents two sets of relationships between threshold voltages and word line voltages with respect to storing features in floating-gate transistors and driving search information on word lines to control gates of the floating-gate transistors. Either set is usable according to usage scenario.

The first set corresponds to a first word line voltage VH1 having a value of V2 473 and a second word line voltage VH2 having a value of V3 474. Thus, with respect to floating-gate transistors programmed to be in Memory State "1" 471, application of either VH1 (having the value V2 473) or application of VH2 (having the value V3 474), results in a high gate overdrive. With respect to floating-gate transistors programmed to be in in Memory State "0" 470, application of VH2 (having the value V3 474) results in a high gate overdrive. However, application of VH1 (having the value V2 473) results in low gate overdrive of those floating-gate transistors.

The second set corresponds to a first word line voltage VL having a value of V1 472 and a second word line voltage VH having a value of V3 474. Thus, with respect to floating-gate transistors programmed to be in Memory State "1" 471, application of VL (having the value of V1 472) results in high gate overdrive. Further, with respect to floating-gate transistors programmed to be in Memory State "0" 470, application of VL (having the value of V1 472) results in no gate overdrive. With respect to floating-gate transistors programmed to be in either Memory State "1" 471 or Memory State "0" 470, application of VH having the value V3 474 results in high gate overdrive.

Figures 4D, 4E:
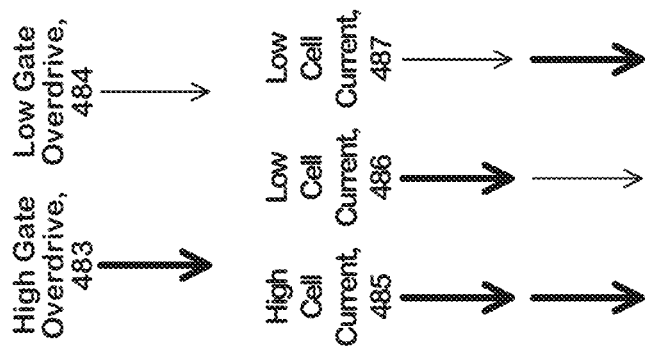
FIG. 4D illustrates icons relating high and low gate overdrive to high and low cell current capability.
FIG. 4E illustrates floating-gate transistor impedance as a function of search information versus stored data.

FIG. 4D illustrates icons relating high and low gate overdrive to low and high floating-gate transistor and cell impedances, conceptually corresponding respectively to high and low cell current capabilities. High Gate Overdrive 483 represents, by a relatively thick arrow, high gate overdrive. Low Gate Overdrive 484 represents, by a relatively thin arrow, low gate overdrive. High Cell Current 485 indicates, by two relatively thick arrows, relatively high cell current capability (e.g., relatively low impedance). Low Cell Current 486 and Low Cell Current 487 indicate, by one relatively thick arrow and one relatively thin arrow, relatively low cell current capability (e.g., relatively high impedance).

FIG. 4E illustrates floating-gate transistor current capability (e.g., impedance) as a function of search information versus stored data. Stored Data Values 499 has four columns, Stored 0 490, Store 1 491, Store Don't Care 492, and Store Invalid 493. Input Search Information 489 has three rows, Search 0 480, Search 1 481, and Wildcard 482. Each cell in the table represents impedance of each floating-gate transistor, in accordance with the icons illustrated in FIG. 4D, as well as effective impedance of the pair of floating-gate transistors depicted in each cell, also in accordance with the icons illustrated in FIG. 4D. Cells 4900, 4902, 4911, 4912, 4920, 4921, 4922, and 4932 represent gate overdrive of both floating-gate transistors in a pair, resulting in a relatively lower impedance. Cells 4901, 4910, 4930, and 4931 represent gate overdrive of only one floating-gate transistor in a pair, resulting in a relatively higher impedance. The relatively lower impedance represents a match between search and data, and the relatively higher impedance represents otherwise.

As a specific example, consider Cell 4900 in a usage scenario of the first set of relationships between threshold voltages and word line voltages VH1 (having the value V2 473) and VH2 (having the value V3 474). Vy is equal to VH2 and Vx is equal to VH1. Thus, the upper floating-gate transistor, controlled by Vy (equal to VH2) has high gate overdrive, and thus a high current capability corresponding to a low impedance. The lower floating-gate transistor, controlled by Vx (equal to VH1) also has high gate overdrive, and thus a high current capability corresponding to a low impedance. Therefore, overall, Cell 4900 has a high current capability corresponding to a low impedance.

As another specific example, consider Cell 4900 in a usage scenario of the second set of relationships between threshold voltages and word line voltages VL (having the value of V1 472) and a second word line voltage VH (having the value V3 474). Vy is equal to VH and Vx is equal to VL. Thus, the upper floating-gate transistor, controlled by Vy (equal to VH) has high gate overdrive, and thus a high current capability corresponding to a low impedance. The lower floating-gate transistor, controlled by Vx (equal to VL) also has high gate overdrive, and thus a high current capability corresponding to a low impedance. Therefore, overall, Cell 4900 has a high current capability corresponding to a low impedance.

3D (Search) Engine Reverse Expansion Encoding

Turning next to reverse expansion encoding, the encoding is conceptually a logical inversion of expansion encoding, but applied only to search inputs, rather than features. Reverse expansion encoding is applicable to approximate matching.

FIG. 5A illustrates an example reverse expansion encoding for search inputs of a 3D (search) engine, in conjunction with an example (non-reverse) expansion encoding for stored features, as a table.

The table is organized in three sections. An upper section describes reverse expansion encoding, as applied to search values to generate search inputs for application to word lines. A middle section describes an example input as reverse expansion encoded. A lower section describes stored value expansion encodings and Hamming distances with respect to the example input.

The first column in the upper section, Search Value 555, is a 6-bit binary search value to be encoded according to reverse expansion encoding. The second column, Reverse Expansion Encoding 554, is a 64-bit binary reverse expansion encoding of the corresponding binary value from the first column. Note that similar to expansion encoding, in reverse expansion encoding to a 64-bit binary value, the most-significant bit is always one. Therefore, in some variations, the most-significant bit is not implemented.

The middle section is a reverse expansion encoding of the search value one, as Search Value Example 550.

The first column in the lower section, Stored Value 551, is a 6-bit binary feature to be encoded according to expansion encoding for storage in memory strings. The second column, Expansion Encoding 552, is a 64-bit binary expansion encoding of the corresponding binary value from the first column. The third column, HD 553, is the Hamming distance between a stored value having the respective expansion encoding and the search input of 1 (Search Value Example 550) in the reverse expansion encoding. Recall that in a 64-bit binary expansion encoding the most-significant bit is always zero and that in a 64-bit binary reverse expansion encoding the most-significant bit is always one. Therefore, comparing a particular value encoded according to the 64-bit binary expansion encoding to the particular value encoded according to the 64-bit binary reverse expansion encoding, always mismatches in the most-significant bit. Therefore, HD 533 ignores the most-significant bit. The Hamming distance is a minimum (1) when the stored value is closest to the search input in the reverse expansion encoding (when ignoring the most-significant bit). The Hamming distance is a maximum (64) when the stored value is the furthest from the search input in the reverse expansion encoding (when ignoring the most-significant bit).

For readability, 64-bit values in the table are separated every four bits by an underscore ("_") character. For brevity, the table omits some values.

Figure 5B:
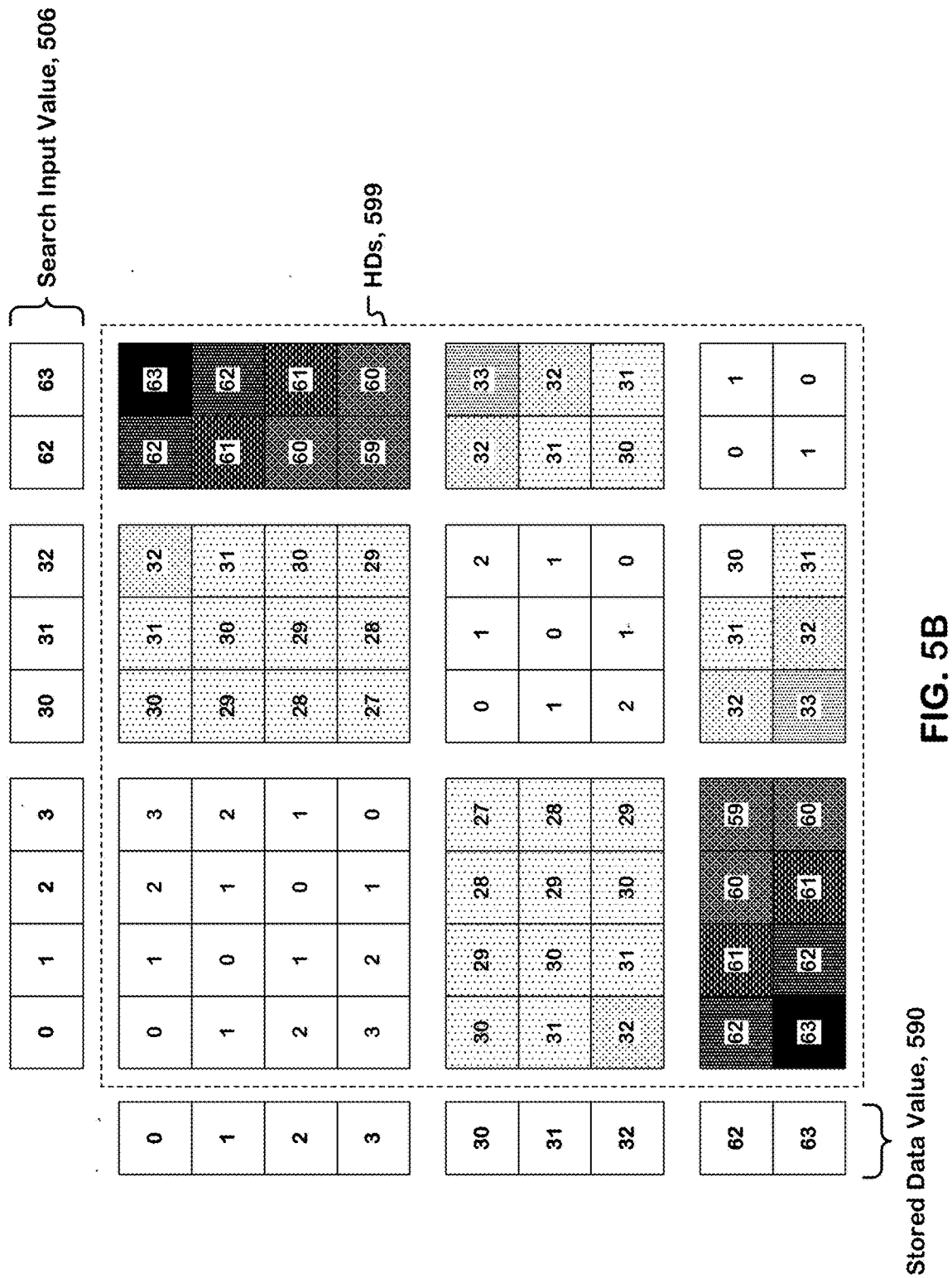
FIG. 5B graphically illustrates, for reverse expansion encoding, example Hamming distances as a function of stored data values and search input values.

FIG. 5B graphically illustrates, for reverse expansion encoding, example Hamming distances (HDs 599) as a function of stored data values (Stored Data Value 590) and search input values (Search Input Value 506).

Figure 6:
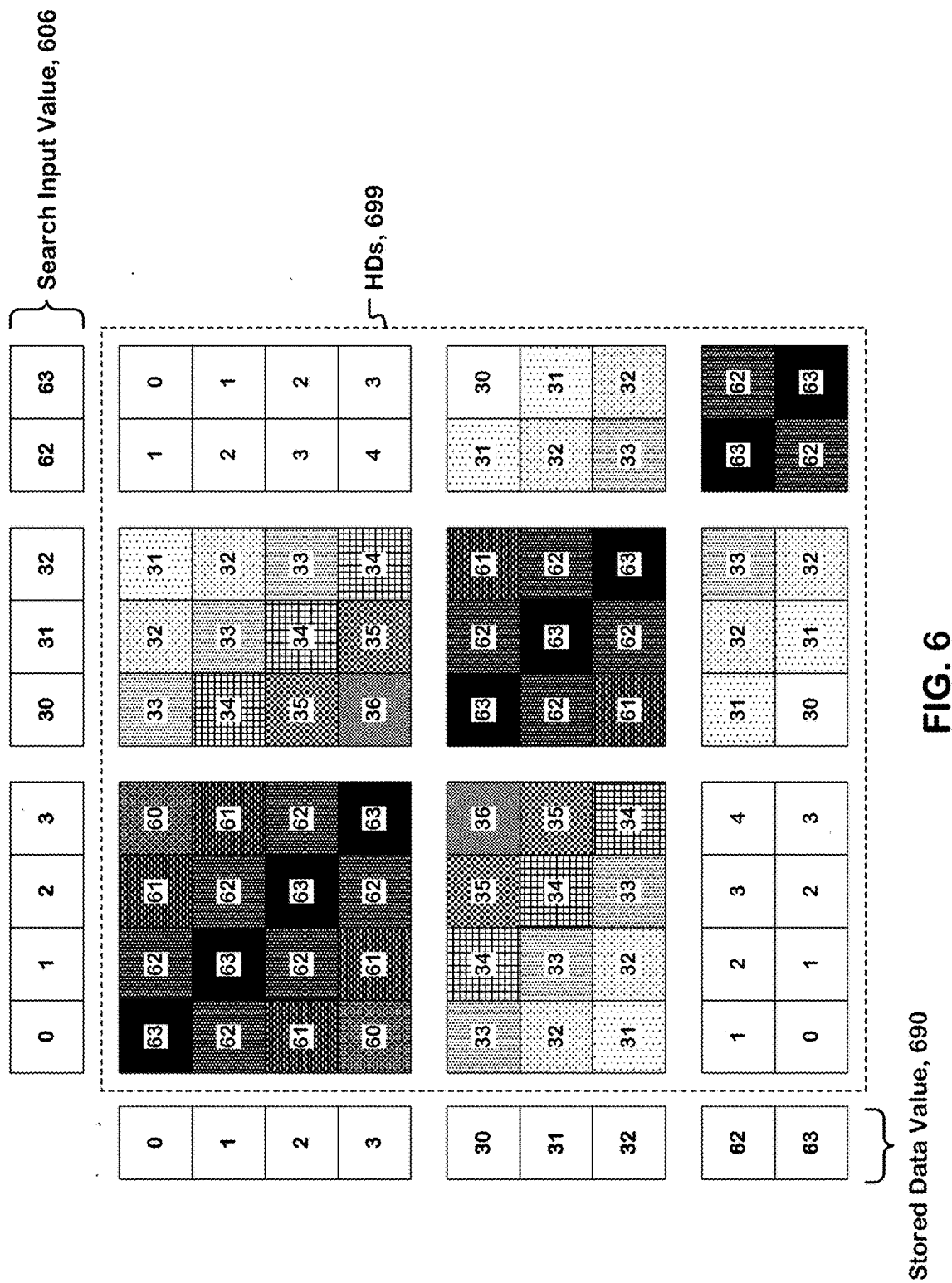
FIG. 6 graphically illustrates, for expansion encoding, example Hamming distances as a function of stored data values and search input values.

FIG. 6 graphically illustrates, for expansion encoding, example Hamming distances (HDs 699) as a function of stored data values (Stored Data Value 690) and search input values (Search Input Value 606). FIG. 6, compared against FIG. 5B, depicts how reverse expansion encoding is "reverse" with respect to expansion encoding.

With respect to FIG. 5B and FIG. 6, relatively lower HDs are depicted in relatively lighter shadings compared to relatively higher HDs that are depicted in relatively darker shadings. The lowest HD is 0 (indicating equality) and is depicted in the lightest shading. The highest HD is 63 (indicating 63 bits mismatch) and is depicted in the darkest shading.

In FIG. 5B (reverse expansion encoding) HDs are 0 along the diagonal. In contrast, in FIG. 6 (expansion encoding) HDs along the diagonal are 63. Further, in FIG. 5B (reverse expansion encoding) HDs are 63 at the lower-left and upper right corners. In contrast, in FIG. 6 (expansion encoding) HDs in the lower-left and upper-right corners are 0. Thus, the HDs of FIG. 5B are "reverse" of those of FIG. 6.

Reverse expansion encoding is usable for approximate matching between searches and stored features. A best match (e.g., high similarity) has a lowest memory string current (e.g., highest impedance). A worst match (e.g., low similarity) has a highest memory string current (e.g., lowest impedance). A number of bits matched (or mismatched) is determinable by measurement of memory string current and/or impedance.

3D (Search) Engine One-Hot Encoding Stored and Input Ranges

FIG. 7A illustrates an example of one-hot encoding with stored ranges, as a multi-part table. The table is organized in two sections. An upper section describes an example input (the value 2) as one-hot encoded as Input 750. A lower section describes one-hot encoded stored ranges and match information with respect to the example input.

The first column in the lower section, Value Range 751, is a list of respective ranges of 6-bit features to be encoded and stored as features to match search inputs against. E.g., 0-2 specifies a stored feature to match a search input from 0-2 (0, 1, or 2). The second column, One-Hot Encoding with Ranges 752, is a 64-bit binary one-hot encoding for the range from the first column. The character "X" indicates the corresponding pair of floating-gate devices are configured to match either a search input of one or zero, e.g., a don't care. The third column, Match? 753, is whether the example input of 2 (One-Hot Encoding with Ranges 752) matches the corresponding stored range feature. The example input of 2 matches the first three one-hot encoded ranges in the table. Note that a one-hot encoding without ranges (e.g., Expansion Encoding 352 of FIG. 3) only matches the example input of 2 with a stored feature value of 2.

For readability, 64-bit values in the table are separated every four bits by an underscore ("_") character. For brevity, the table omits some values.

FIG. 7B illustrates a one-hot encoding on input range example, as a multi-part table. The table is organized in two sections. An upper section describes an example input range (0-4) as one-hot encoded as One-Hot Encoding on Input Range Example 760. The character "X" indicates the corresponding search input is a Wildcard to match any corresponding stored feature bit. A lower section describes one-hot encoded stored values and match information with respect to the input range example.

The first column in the lower section, Value 761, is a 6-bit binary value to be encoded according to one-hot encoding. The second column, One-Hot Encoding 752, is a 64-bit binary one-hot encoding of the corresponding binary value from the first column. The third column, Match? 763, is whether the example input range of 0-4 matches the corresponding stored feature. The example input range of 0-4 matches the first three one-hot encoded features in the table.

For readability, the 64-bit values are separated every four bits by an underscore ("_") character. For brevity, the table omits some values.

One-hot encoding is usable for exact matching between searches and stored features. One-hot encoding with stored ranges is usable for approximately matching searches. Programming a stored feature with more don't cares increases the range of search inputs that the stored feature matches. One-hot encoding of input ranges is usable for approximately matching searches. Altering which bits are Wildcards moves the range of search inputs that match. For example, a stored feature of XX1XX000 . . . 00 matches search inputs of 0 to 4, and a stored feature of 0XX1XX000 . . . 00 matches search inputs of 1 to 5.

3D (Search) Engine Operation

Figure 8:
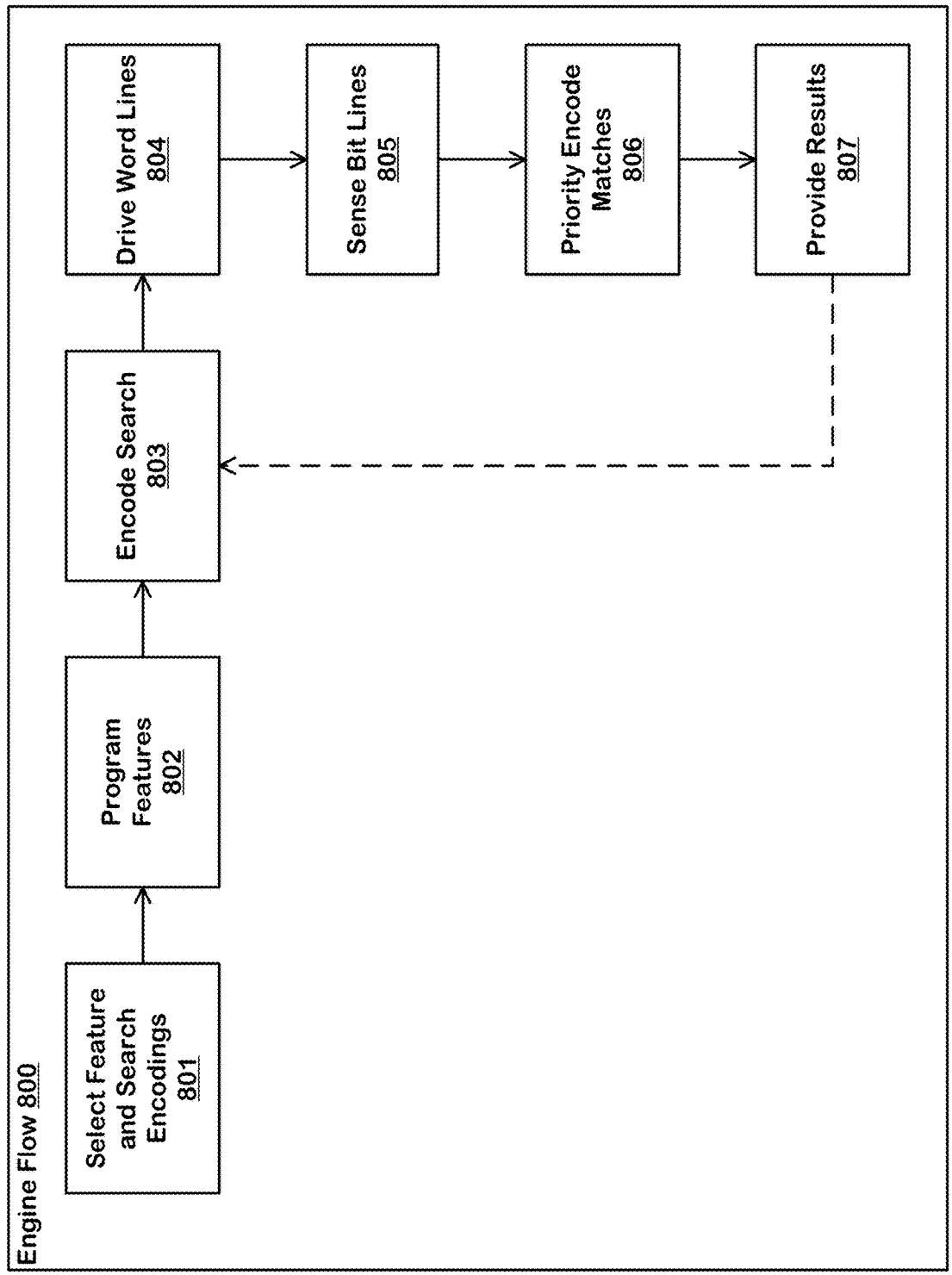
FIG. 8 illustrates an example operating flow for a 3D (search) engine.

FIG. 8 illustrates an example operating flow for a 3D (search) engine (such as 3D Engine 9000 of FIG. 1A), as Engine Flow 800. Flow begins at Select Feature and Search Encodings 801. In some usage scenarios, identical encodings are used for features and searches. In some usage scenarios, e.g., reverse expansion encoding, different encodings are used for features versus searches. Flow then proceeds to Program Features 802. The features to be searched against are programmed according to the selected feature encoding. Flow then proceeds to Encode Search 803. The search is encoded according to the selected search encoding. In some applications, a search is performed based on one or more parameters optionally including a mask and/or range information. Flow then proceeds to Drive Word Lines 804. The word lines are driven according to the search encoding. Flow then proceeds to Sense Bit Lines 805. The bit line sensing is performed by sense amplifiers. Flow then proceeds to Priority Encode Matches 806. Match indications, as provided by the sense amplifiers, are processed to determine prioritized match information (e.g., as performed by Page Buffer, Cache, Priority Encoder 9008 of FIG. 1A). Flow then proceeds to Provide Results 807. The results are provided, for example, to a host agent (e.g., as Output Matching Result(s) 9009 of FIG. 1A). Flow then optionally proceeds back to encode a next search (Encode Search 803).

3D (Search) Engine Device and Appliance

Figure 9:
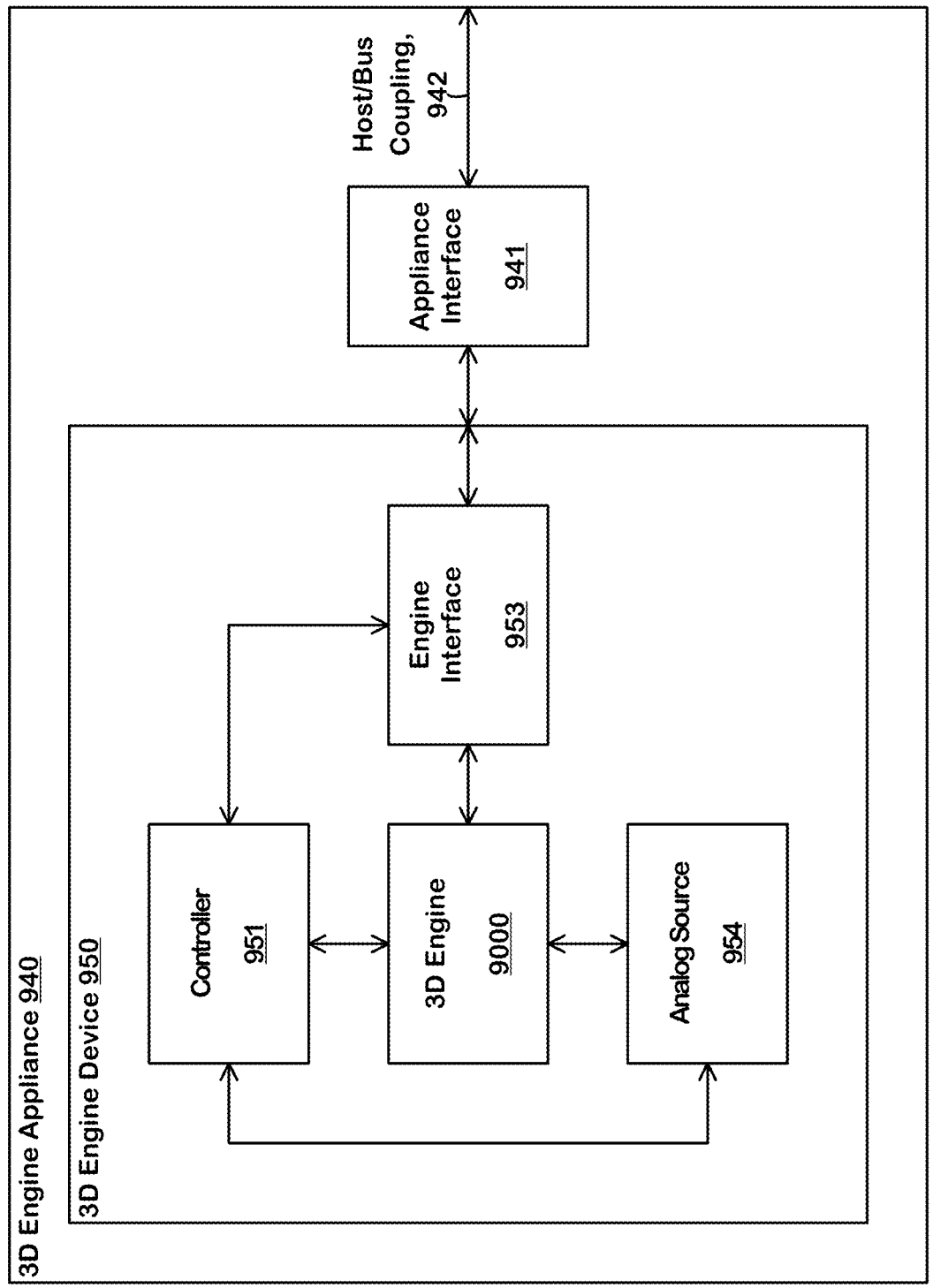
FIG. 9 illustrates an example 3D engine appliance comprising an example 3D engine device.

FIG. 9 illustrates an example 3D engine appliance comprising an example 3D engine device, respectively as 3D Engine Appliance 940 and 3D Engine Device 950.

3D Engine Appliance 940 comprises one or more instances of 3D engine devices, for clarity illustrated as a single device, 3D Engine Device 950, as well as Appliance Interface 941.

3D Engine Device 950 comprises 3D Engine 9000 (e.g., as illustrated and described with respect to FIGS. 1A-1C). 3D Engine Device 950 further comprises Controller 951, Engine Interface 953, and Analog Source 954. Conceptually, elements of 3D Engine Device 950 and/or 3D Engine Appliance 940 (other than 3D Engine 9000) serve to provide 3D Engine 9000 with Features 9001 and Searches 9002 from a host, and to return to the host Result(s) 9099.

Controller 951 is enabled to provide overall control of operations of and between various hardware circuitry blocks of 3D Engine Device 950. For example, Controller 951 coordinates operation of Engine Interface 953 with 3D Engine 9000. For another example, Controller 951 coordinates operation of Analog Source 954 with respect to configuration information. For another example, Controller 951 optionally coordinates feature and/or search encoding as well as feature programming as directed via Engine Interface 953 and as applicable to 3D Engine 9000. For other examples, Controller 951, in various configurations, is enabled to perform operations relating to any one or more of operations 801-807 of Fig.8.

Engine Interface 953 is enabled to interface an agent external to 3D Engine Device 950 (such as a host via Appliance Interface 941 and Host/Bus Coupling 942) to use 3D Engine 9000. Example uses are to receive commands and data, as well as to return status relating to feature and/or search encoding, feature programming, and/or search requesting.

Analog Source 954 is enabled to generate and/or provide one or more analog outputs to, e.g., memory arrays, bit line circuitry, sense amplifier circuitry, and/or word line circuitry of the 3D (search) engine memory arrays. The analog outputs comprise zero or more voltage and/or current sources (such as reference sources), for instance as generated by one or more bias circuits.

In operation, a host provides, e.g., commands for selection of feature and/or search encoding via Host/Bus Coupling 942 and Appliance Interface 941. Appliance Interface 941 then provides the commands to Engine Interface 953 and the commands are processed by 3D Engine 9000 as directed by Controller 951. Examples of other similarly processed commands include feature programming according to the selected feature encoding, and search performing according to the selected search encoding. Status or processed commands as well as results of searches are returned to the host via Host/Bus Coupling 942 and Appliance Interface 941 as provided by Controller 951 and/or 3D Engine 9000 via Engine Interface 953. In some variations of 3D Engine Device 950, Controller 951 is enabled to operate one or more 2D (search) engines of 3D Engine 9000 concurrently.

In operation, a host external to 3D Engine Appliance 940 provides feature information for 3D Engine Device 950 to program into 3D Engine 9000. Subsequently, the host provides one or more search parameters to 3D Engine Appliance 940. 3D Engine Appliance 940, via Appliance Interface 941, Although FIG. 9 illustrates 3D Engine 9000 used in 3D Engine Device 950 in turn used in 3D Engine Appliance 940, other usage scenarios are possible. For example, various elements (e.g., integrated circuits, one or more die of a system-on-a-chip, and/or packaged die) comprise one or more 3D engine elements identical to, substantially similar to, or based on 3D Engine 9000.

Other partitionings of elements, coupling between elements, and capabilities and/or capacities of elements illustrated in the figure are contemplated, as well as additional elements, according to usage requirements.

3D (Search) Engine System

Figure 10:
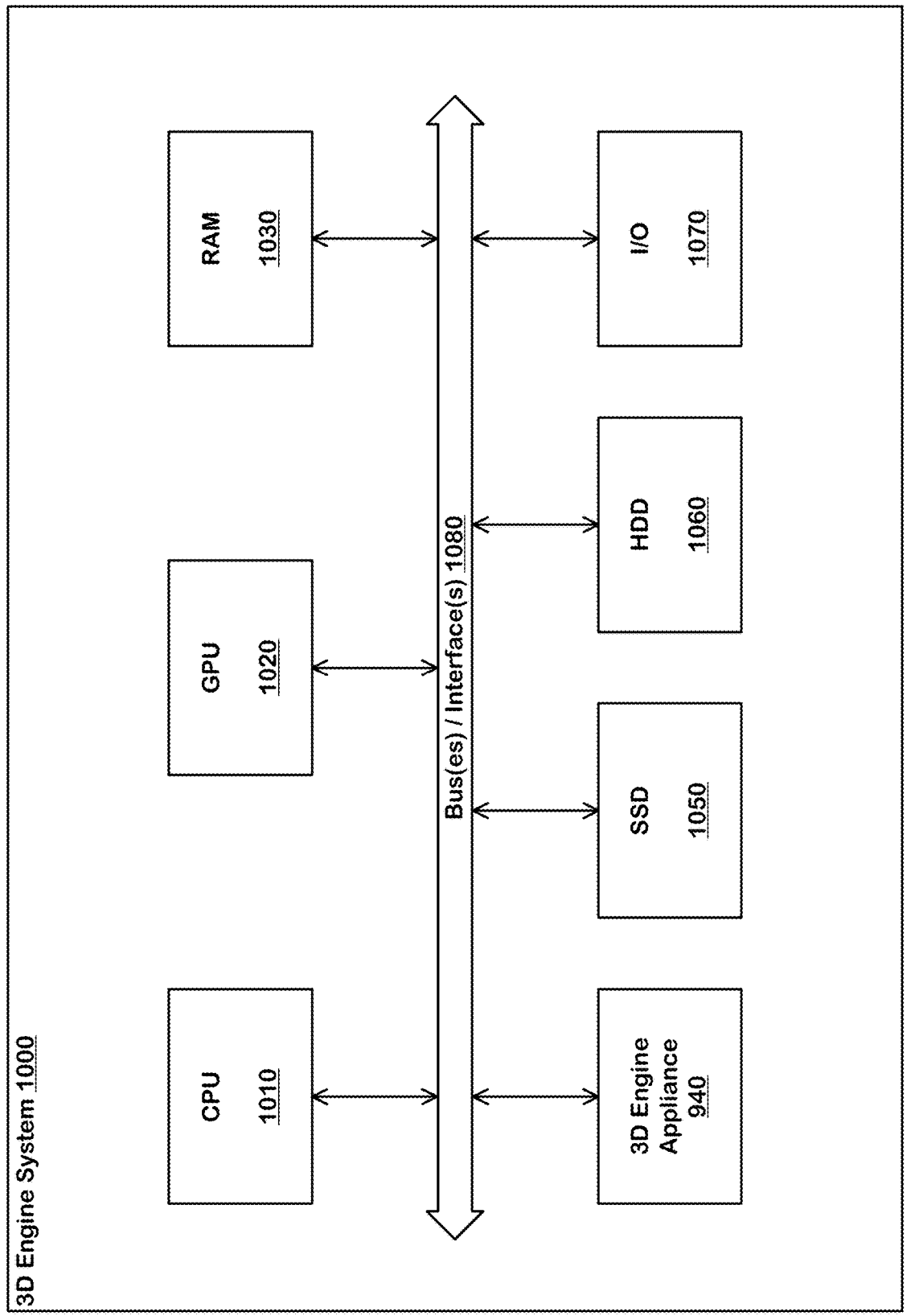
FIG. 10 illustrates an example hardware system having a 3D (search) Engine.

FIG. 10 illustrates an example hardware system having a 3D (search) Engine, as 3D Engine System 1000. The system comprises hardware blocks CPU 1010, GPU 1020, RAM 1030, 3D Engine Appliance 940 (of FIG. 9), SSD 1050, HDD 1060, and I/O 1070 that are coupled by hardware block Bus(es)/Interface(s) 1080.

CPU 1010 comprises one or more processing units, such as any combination of hardware units enabled to execute programmed instructions, microprocessors, signal processors, AI processors, and the like.

GPU 1020 comprises one or more processing units, such as any combination of units enabled to accelerate processing for processing that is subject to relatively highly parallel processing, such as graphics processing, signal processing, and/or AI processing.

RAM 1030 comprises one or more storage elements for storage of instructions and/or data in greater quantities than storage internal to CPU 1010 and/or GPU 1020. RAM 1030 is implementable, e.g., via volatile memory elements, such as DRAMs and/or SRAMs.

SSD 1050 comprises one or more storage elements, such as flash-based storage elements for storage of instructions and/or data optionally accessible with reduced latency compared to HDD 1060.

HDD 1060 comprises one or more storage elements, such as rotation-based magnetic and/or optical non-volatile storage elements (e.g., disks) for storage of instructions and/or data optionally in greater quantities than SSD 1050 is enabled to store.

I/O 1070 comprises elements to interface any combination of CPU 1010, GPU 1020, RAM 1030, 3D Engine Appliance 940, SSD 1050, and/or HDD 1060 to elements external to 3D Engine System 1000. Example external elements include mass storage devices, local and wide-area networks (such as the Internet), human interface components (such as keyboards, mice, and/or monitors), and other elements providing capabilities to extend and/or augment capabilities not otherwise provided by 3D Engine System 1000. I/O 1070 variously comprises one or more serial and/or parallel communication channels as well as optional protocol conversion and/or adaptation capabilities to facilitate communication between the elements coupled to it.

Bus(es)/Interface(s) 1080 enables communication between the elements coupled to it (e.g., CPU 1010, GPU 1020, RAM 1030, 3D Engine Appliance 940, SSD 1050, HDD 1060, and/or I/O 1070). Bus(es)/Interface(s) 1080 variously comprises one or more serial and/or parallel communication channels as well as optional protocol conversion and/or adaptation capabilities to facilitate communication between the elements coupled to it.

Other partitionings of elements, coupling between elements, and capabilities and/or capacities of elements illustrated in the figure are contemplated, as well as additional elements, according to usage requirements.

In some circumstances, 3D Engine Appliance 940 enables reductions in processing load (e.g., on CPU 1010 and/or GPU 1020) and/or reductions in traffic on Bus(es)/Interface(s) 1080 by performing processing locally.

For example, using one-hot encoding (e.g., for stored features and/or for search input ranges) to enable range matching, searches among large databases are accomplished entirely within 3D Engine Appliance 940 once features are programmed. For another example, using reverse expansion encoding to enable approximate matching, comparisons among large AI datasets are accomplished entirely within 3D Engine Appliance 940 once features are programmed. For another example, using expansion and/or one-hot encoding, sorting large datasets is accomplished entirely within 3D Engine Appliance 940 once features are programmed.

3D (Search) Engine Additional Information

Example memory technologies applicable to memory arrays of 3D (search) engines as disclosed herein include floating-gate, split-gate, SONOS, floating dot, DRAM, DRAM-like (e.g., 2T0C), FeFET, and any memory technology compatible with search via word lines and bit lines. Exemplary SONOS memory technology (sometimes referred to as charge trap memory) uses an insulating layer (e.g., of silicon nitride) with traps to capture and retain charge as injected from a channel. Exemplary floating dot memory technology conceptually replaces a floating gate with a floating silicon nanodot or embeds floating silicon nanodots in a polysilicon gate. Exemplary 2T0C memory technology uses parasitic capacitance of a read transistor to store charge rather than an explicit storage capacitor. Exemplary FeFET memory technology uses permanent electrical field polarization of ferroelectric material embedded between a gate and a source-gate conduction region to store information. Example memory structures applicable to memory arrays of 3D (search) engines include 2D structures (e.g., 2D flash structures) and 3D structures (e.g., 3D flash structures). Example array architectures applicable to memory arrays of 3D (search) engines include NOR/OR-type array architectures and AND/NAND-type array architectures.

It is understood that the foregoing disclosure presents implementations, variations, embodiments, and examples in an intended illustrative sense rather than in a limiting sense. It is contemplated that modifications and combinations are discernible that will be within the spirit of the disclosure and the scope of the following claims. What is claimed is:

The invention claimed is:

1. A computing system comprising:
    a plurality of memories each comprising:
        a respective match line coupled to a respective sense amplifier,
        a respective source line, and
        a respective plurality of memory strings each coupled to (a) the respective match line and (b) the respective source line, and each memory string comprising a respective plurality of series-connected floating-gate transistors each having and being responsive to (c) a respective configured state and (d) a respective control input; and
    a plurality of word lines each coupled to a respective one of the respective control inputs of each of the series-connected floating-gate transistors; and
    a search encoder enabled to receive a search and drive the word lines according to a search encoding;
    wherein (e) each memory string is enabled to couple the respective match and source lines that the respective memory string is coupled to via an a match-found impedance responsive to the configured states of the memory string exactly matching the control inputs of the series-connected floating-gate transistors of the memory string, and (f) each sense amplifier is enabled to generate a respective indication of whether the match line it is coupled to is coupled to the source line via the match-found impedance; and
    wherein (g) each memory string is further enabled to couple the respective match and source lines that the memory string is coupled to via a no-match-found impedance responsive to the configured states of the memory string not exactly matching the control inputs of the series-connected floating-gate transistors of the memory string, and (h) each sense amplifier is further enabled to generate a respective indication of whether the match line it is coupled to is coupled to the source line via the no-match-found impedance.

2. The computing system of claim 1, wherein the word lines are operated in pairs according to the search encoding and the configured states are managed in pairs according to a feature encoding.

3. The computing system of claim 1, wherein each of the configured states corresponds to a respective threshold voltage.

4. The computing system of claim 3, wherein each of the respective control inputs is coupled to a respective gate of one more of the series-connected floating-gate transistors.

5. The computing system of claim 3, wherein the threshold voltages are settable via one or more programming operations.

6. The computing system of claim 1, wherein each of the memory strings comprises a respective memory string enable device responsive to a respective memory string enable control input to selectively enable or disable the respective memory string independently of the word lines.

7. A computing method comprising:
    receiving one or more search parameters;
    encoding the search parameters according to a particular one of a plurality of search encodings to generate pairs of word line voltages, the particular search encoding enabling a search for a match with a feature stored in a pair of floating-gate transistors according to a particular one of a plurality of feature encodings, and wherein the particular search encoding and the particular feature encoding enable representation of a one, a zero, and either a one or a zero;
    driving pairs of word lines of a plurality of series-connected instances of the pair of floating-gate transistors according to the generated word line voltages, the series-connected instances organized as respective pluralities of memory strings operable in parallel to affect a plurality of shared match lines, each shared match line coupled to two or more of the memory strings, and each pair of word lines coupled to at least two of the instances of the pair of floating-gate transistors;
    sensing voltage changes on the shared match lines to determine which of the shared match lines have a voltage change greater than a predetermined sense threshold; and providing results of the determining as indications of relative matching between the search parameters and the stored features.

8. The computing method of claim 7, wherein at least one of the plurality of search encodings or at least one of the plurality of feature encodings is in accordance with at least one of an expansion encoding and a one-hot encoding.

9. The computing method of claim 7, wherein at least one of the plurality of search encodings or at least one of the plurality of feature encodings is in accordance with a reverse expansion encoding.

10. The computing method of claim 7, wherein at least one of the stored features corresponds to a range stored using a one-hot encoding.

11. The computing method of claim 7, wherein at least one of the pairs of word line voltages is in accordance with a range encoded as a one-hot encoding.

12. The computing method of claim 7, wherein at least one of the plurality of search encodings or at least one of the plurality of feature encodings is in accordance with a low effect encoding.

13. A computing system comprising:
   interface circuitry to enable a host agent to provide a search and to receive one or more results of the search;
   a plurality of blocks of memory strings, each block comprising a respective plurality of memory strings each receiving a same set of word lines having voltages determinable responsive to the search;
   a search encoder enabled to receive the search and drive the word lines according to a search encoding;
   a plurality of sense amplifiers each coupled to a corresponding one of the memory strings from each of the blocks; and
   priority encoder circuitry enabled to receive match indications from the sense amplifiers;
   wherein the sense amplifiers are enabled to determine, with respect to matches between (1) feature information stored in the memory strings coupled to the sense amplifier and (2) the word lines received by the memory strings coupled to the sense amplifier, that (3) there are no matches and (4) there is at least one match; and
   wherein the priority encoder circuitry, based on the determinations of the sense amplifiers, is enabled to indicate at least a portion of the results as a highest priority match of any matches identified by the sense amplifiers.

14. The computing system of claim 13, further comprising the host agent.

15. The computing system of claim 13, wherein the priority encoder circuitry, based on the determinations of the sense amplifiers, is enabled to indicate at least a portion of the results as a second highest priority match of any matches identified by the sense amplifiers.

16. The computing system of claim 13, wherein the feature information is stored in the memory strings by configuring threshold voltages of floating-gate transistors of the memory strings.

17. The computing system of claim 13, wherein two or more of the blocks are operable concurrently.

18. The computing system of claim 13, wherein a feature encoding is used to encode at least some of the feature information.

19. The computing system of claim 18, wherein the feature encoding is at least one of an expansion encoding, a reverse expansion encoding, a one-hot encoding, and a low effect encoding.

20. The computing system of claim 13, wherein the computing system is part of a system-on-a-chip (SOC).

* * * * *